(12) United States Patent
Miura

(10) Patent No.: US 9,600,611 B2
(45) Date of Patent: Mar. 21, 2017

(54) MOTOR SELECTION DEVICE

(71) Applicant: NSK LTD., Tokyo (JP)

(72) Inventor: Shota Miura, Kanagawa (JP)

(73) Assignee: NSK LTD., Tokyo (JP)

( * ) Notice: Subject to any disclaimer, the term of this patent is extended or adjusted under 35 U.S.C. 154(b) by 0 days.

(21) Appl. No.: 14/899,172

(22) PCT Filed: Dec. 19, 2013

(86) PCT No.: PCT/JP2013/084161
§ 371 (c)(1),
(2) Date: Dec. 17, 2015

(87) PCT Pub. No.: WO2014/203429
PCT Pub. Date: Dec. 24, 2014

(65) Prior Publication Data
US 2016/0139583 A1    May 19, 2016

(30) Foreign Application Priority Data

Jun. 19, 2013  (JP) ................................ 2013-128948
Sep. 25, 2013  (JP) ................................ 2013-199000

(51) Int. Cl.
*H02P 6/04*    (2016.01)
*G06F 17/50*   (2006.01)
(Continued)

(52) U.S. Cl.
CPC ......... *G06F 17/5009* (2013.01); *G05B 19/19* (2013.01); *G06F 17/10* (2013.01); *H02P 23/0004* (2013.01); *H02P 29/00* (2013.01)

(58) Field of Classification Search
CPC ... G05B 19/19; H02P 6/00; H02P 6/04; H02P 6/06; H02P 6/08; H02P 7/00
(Continued)

(56) References Cited

U.S. PATENT DOCUMENTS 6,018,694 A * 1/2000 Egami ................... B60K 6/24
                                              180/65.23
7,800,329 B2   9/2010 Umeda et al.
(Continued)

FOREIGN PATENT DOCUMENTS

CN    101292418 A    10/2008
CN    102292910 A    12/2011
(Continued)

OTHER PUBLICATIONS

Communication, Jul. 13, 2016, from the State Intellectual Property Office of the P.R.C., in counterpart Chinese application No. 201380003311.7.
(Continued)

*Primary Examiner* — Antony M Paul
(74) *Attorney, Agent, or Firm* — Sughrue Mion, PLLC

(57) ABSTRACT

A motor selection device includes a computer including a storage device and a calculation device. The storage device stores data of acceleration time, constant speed time, deceleration time, stop time, maximum output torque for each motor, dynamic friction torque, and constant load torque. To select selectable motors and to suggest an optimal operation pattern among motor operation patterns, the calculation device includes a central processing unit (CPU) and performs effective torque calculation by calculating torque in the acceleration time, in the constant speed time, in the deceleration time, and in the stop time based on data stored in the storing unit, and calculating the effective torque by giving a first torque, a second torque, a third torque, a fourth torque, the acceleration time, the constant speed time, the deceleration time, and the stop time to a predetermined formula.

4 Claims, 18 Drawing Sheets

(51) Int. Cl.
*G05B 19/19* (2006.01)
*G06F 17/10* (2006.01)
*H02P 23/00* (2016.01)
*H02P 29/00* (2016.01)

(58) Field of Classification Search
USPC .... 318/139, 400.01, 400.02, 400.14, 400.15, 318/700, 701, 721, 727, 799, 430, 432, 318/268, 266, 466, 437, 801; 198/341.01, 198/341.02, 437, 459.8, 463.1, 792; 388/930; 700/302, 304; 701/110
See application file for complete search history.

(56) References Cited

U.S. PATENT DOCUMENTS

| | | | |
|---|---|---|---|
| 8,706,354 B2 | 4/2014 | Imamura et al. | |
| 9,423,777 B2 * | 8/2016 | Ueda | G05B 6/02 |
| 2003/0011339 A1 | 1/2003 | Leenhouts | |

FOREIGN PATENT DOCUMENTS

| | | |
|---|---|---|
| EP | 2 149 982 A1 | 2/2010 |
| JP | 2003-99479 A | 4/2003 |
| JP | 2006-42589 A | 2/2006 |
| JP | 2006-260350 A | 9/2006 |
| WO | 2008/139800 A1 | 11/2008 |

OTHER PUBLICATIONS

International Search Report of PCT/JP2013/084161 dated Mar. 25, 2014. [PCT/ISA/210].

Unknown: "Orientalmotors—Technical Reference" Dec. 31, 2012, XP055334438, Retrieved from the Internet: URL:http://www.orientalmotor.com/products/pdfs/2012-2013/G/usa_tech_calculation.pdf [retrieved on Jan, 11, 2017].

Communication issued Jan. 20, 2017 by the European Patent Office in counterpart European Application No. 13887449.0.

* cited by examiner

FIG.5

| SIMULATION CONDITION | | | |
|---|---|---|---|
| FIRST CONDITION | | INPUT VALUE | UNIT |
| POSITIONING ANGLE (*) | | | ° |
| REQUESTED POSITIONING TIME | | | s |
| REQUESTED STOP TIME | | | s |
| TORQUE LIMIT | | | % |
| MAXIMUM ROTATIONAL SPEED LIMIT | | | $s^{-1}$ |

| SECOND CONDITION | INPUT VALUE | UNIT |
|---|---|---|
| MOMENT OF INERTIA OF LOAD (*) | | $kgm^2$ |
| LOAD TORQUE (CONSTANT) | | Nm |
| DYNAMIC FRICTION TORQUE | | Nm |

EXECUTION (*): REQUIRED FIELD

N: ROTATIONAL SPEED OF MOTOR [s-1]
T: OUTPUT TORQUE AT ROTATIONAL SPEED N [N·m]
Tm: CONSTANT LOAD TORQUE [N·m]
Ti: DYNAMIC FRICTION TORQUE [N·m]
ta: ACCELERATION TIME [s]
tc: CONSTANT SPEED TIME [s]
td: DECELERATION TIME [s]
tb: STOP TIME [s]
tp: CYCLE PERIOD [s] (=ta+tc+td+tb)
te: POSITIONING TIME [s] (=ta+tc+td)

FIG. 10

MECHANICAL ELEMENTS DATA / DB

| SERIES NAME (BS) | REFERENCE NUMBER (BN) | N-T CHARACTERISTIC (DNT) | BREAK POINT INFORMATION (Dbk) | TORQUE CHARACTERISTIC INFORMATION (DNTK) || RATED TORQUE (DRT) | MOMENT OF INERTIA OF ROTOR (DJI) | MAXIMUM OUTPUT TORQUE (DMT) | SEAL FRICTION TORQUE (DST) | MAXIMUM ROTATIONAL SPEED Nmax (DNmax) | |
|---|---|---|---|---|---|---|---|---|---|---|---|
| | | | | COEFFICIENT a | COEFFICIENT b | | | | | | |
| PS SERIES | M-PS1xxx | NTps1 | bpk1 | aps1 | bps1 | rt1 | Jir1 | mt1 | st1 | nm1 | ... |
| | M-PS2xxx | NTps2 | bpk2 | aps2 | bps2 | rt2 | Jir2 | mt2 | st2 | nm2 | ... |
| | M-PS3xxx | NTps3 | bpk3 | aps3 | bps3 | rt3 | Jir3 | mt3 | st3 | nm3 | ... |
| | M-PS4xxx | NTps4 | bpk4 | aps4 | bps4 | rt4 | Jir4 | mt4 | st4 | nm4 | ... |
| | M-PS5xxx | NTps5 | bpk5 | aps5 | bps5 | rt5 | Jir5 | mt5 | st5 | nm5 | ... |
| | M-PS6xxx | NTps6 | bpk6 | aps6 | bps6 | rt6 | Jir6 | mt6 | st6 | nm6 | ... |
| | M-PS7xxx | NTps7 | bpk7 | aps7 | bps7 | rt7 | Jir7 | mt7 | st7 | nm7 | ... |
| PN SERIES | M-PN1xxx | NTpn1 | bpk8 | apn1 | bpn1 | rt8 | Jir8 | mt8 | st8 | nm8 | ... |
| | M-PN2xxx | NTpn2 | bpk9 | apn2 | bpn2 | rt9 | Jir9 | mt9 | st9 | nm9 | ... |
| | M-PN3xxx | NTpn3 | bpk10 | apn3 | bpn3 | rt10 | Jir10 | mt10 | st10 | nm10 | ... |
| | M-PN4xxx | NTpn4 | bpk11 | apn4 | bpn4 | rt11 | Jir11 | mt11 | st11 | nm11 | ... |
| | M-PN5xxx | NTpn5 | bpk12 | apn5 | bpn5 | rt12 | Jir12 | mt12 | st12 | nm12 | ... |
| | M-PN6xxx | NTpn6 | bpk13 | apn6 | bpn6 | rt13 | Jir13 | mt13 | st13 | nm13 | ... |
| Z SERIES | M-PZ1xxx | NTpz1 | bpk14 | apz1 | bpz1 | rt14 | Jir14 | mt14 | st14 | nm14 | ... |
| | M-PZ2xxx | NTpz2 | bpk15 | apz2 | bpz2 | rt15 | Jir15 | mt15 | st15 | nm15 | ... |
| | M-PZ3xxx | NTpz3 | bpk16 | apz3 | bpz3 | rt16 | Jir16 | mt16 | st16 | nm16 | ... |

| REPEATED POSITIONING ACCURACY | SETTLING TIME | SELEC-TION | |
|---|---|---|---|
| ±100 SECOND ~ | 0.001s | ● | R1 |
| ±10 ~ 100 SECOND | 0.04s | ○ | R2 |
| ±2 ~ 10 SECOND | 0.1s | ○ | R3 |

| ITEM | RESULT | THRE-SHOLD | DETER-MINATION | COMMENT |
|---|---|---|---|---|
| MOMENT OF INERTIA OF LOAD [kgm²] | 0.064 | 0.015-0.24 | OK | |
| LOAD TORQUE (CONSTANT) [Nm] | 0 | LOWER THAN 1.5 | OK | |
| POSITIONING TIME | 0.059 | EQUAL TO OR SHORTER THAN 0.3 | OK | |
| CYCLE PERIOD | 0.429 | EQUAL TO OR SHORTER THAN 0.3 | NG | RATED TORQUE IS NOT ENOUGH. BY PERFORMING TORQUE LIMIT OR MAXIMUM SPEED LIMIT, POSITIONING TIME BECOME LONGER BUT STOP TIME BECOME SHORTER AND REQUESTED CYCLE PERIOD MAY BE SATISFIED. REQUESTED CYCLE PERIOD= REQUESTED POSITIONING TIME+ REQUESTED STOP TIME |

DETAIL OF SIMULATION — G2

FIG.21

LIST OF SIMULATION RESULT

| SERIES NAME | REFERENCE NUMBER | COMPREHENSIVE DETERMINATION | COMMENT | SELECTION |
|---|---|---|---|---|
| PS SERIES | M-PS1xxx | △ | CYCLE PERIOD OF SHORTEST POSITIONING OPERATION EXCEED REQUESTED CYCLE PERIOD. REQUEST MAY BE SATISFIED BY ADJUSTING OUTPUT TORQUE AND MAXIMUM ROTATIONAL SPEED. | ○ |
| | M-PS2xxx | △ | CYCLE PERIOD OF SHORTEST POSITIONING OPERATION EXCEED REQUESTED CYCLE PERIOD. REQUEST MAY BE SATISFIED BY ADJUSTING OUTPUT TORQUE AND MAXIMUM ROTATIONAL SPEED. | ○ |
| | M-PS3xxx | ○ | UTILIZATION IS POSSIBLE. | ○ |
| | M-PS4xxx | △ | CYCLE PERIOD OF SHORTEST POSITIONING OPERATION EXCEED REQUESTED CYCLE PERIOD. REQUEST MAY BE SATISFIED BY ADJUSTING OUTPUT TORQUE AND MAXIMUM ROTATIONAL SPEED. | ○ |
| | M-PS5xxx | ○ | UTILIZATION IS POSSIBLE. | ○ |
| | M-PS6xxx | × | MOMENT OF INERTIA OF LOAD IS NOT IN RECOMMENDED RANGE. | ○ |
| | M-PS7xxx | × | MOMENT OF INERTIA OF LOAD IS NOT IN RECOMMENDED RANGE. | ○ |
| PN SERIES | M-PN1xxx | △ | CYCLE PERIOD OF SHORTEST POSITIONING OPERATION EXCEED REQUESTED CYCLE PERIOD. REQUEST MAY BE SATISFIED BY ADJUSTING OUTPUT TORQUE AND MAXIMUM ROTATIONAL SPEED. | ○ |
| | M-PN2xxx | × | MOMENT OF INERTIA OF LOAD IS NOT IN RECOMMENDED RANGE. | ○ |
| | M-PN3xxx | × | MOMENT OF INERTIA OF LOAD IS NOT IN RECOMMENDED RANGE. | ○ |
| | M-PN4xxx | × | MOMENT OF INERTIA OF LOAD IS NOT IN RECOMMENDED RANGE. | ○ |
| | M-PN5xxx | × | MOMENT OF INERTIA OF LOAD IS NOT IN RECOMMENDED RANGE. | ○ |
| | M-PN6xxx | × | MOMENT OF INERTIA OF LOAD IS NOT IN RECOMMENDED RANGE. | ○ |
| Z SERIES | M-PZ1xxx | × | MOMENT OF INERTIA OF LOAD IS NOT IN RECOMMENDED RANGE. | ○ |
| | M-PZ2xxx | × | MOMENT OF INERTIA OF LOAD IS NOT IN RECOMMENDED RANGE. | ○ |
| | M-PZ3xxx | × | MOMENT OF INERTIA OF LOAD IS NOT IN RECOMMENDED RANGE. | ○ |

INPUT SCREEN     SELECTION

MOTOR SELECTION DEVICE

CROSS REFERENCE TO RELATED APPLICATIONS

This application is a National Stage of International Application No. PCT/JP2013/084161 filed Dec. 19, 2013, claiming priority based on Japanese Patent Application Nos. 2013-128948, filed Jun. 19, 2013, and 2013-199000, filed Sep. 25, 2013, the contents of all of which are incorporated herein by reference in their entirety.

BACKGROUND OF THE INVENTION

1. Field of the Invention

The present invention relates to a motor selection device.

2. Description of the Related Art

In Prior Art 1, a servo motor selection device including: a selection unit for a servo system driven by a servomotor; an input unit for mechanical elements of a servo system; an input unit for a movement pattern of a load of a servo system; a calculation unit to acquire required specifications for a servomotor based on output results of the selection unit for a servo system, the input unit for mechanical elements of a servo system, and the input unit for a load movement pattern; and a search unit for a servomotor adaptive to the servo system based on the required specifications acquired in the calculation unit.

PATENT DOCUMENT PRIOR ART

Prior Art 1: Japanese Patent Application Laid-open No. 2006-42589

In the technology of Prior Art 1, friction torque and a constant load are not considered adequately in a calculation of effective torque.

The present invention has been provided in view of the forgoing and is to provide a motor selection device which can provide information of effective torque closer to actual effective torque.

SUMMARY OF THE INVENTION

It is an object of the present invention to at least partially solve the problems in the conventional technology. According to an aspect of the invention, a motor selection device comprises a computer including a storage unit and a calculation unit in order to select a plurality of selectable motors and to suggest an optimal operation pattern among motor operation patterns, each of the motor operation patterns being prescribed by positioning time during which a motor output shaft of a motor rotates by a positioning angle to rotate a load, and stop time during which the motor output shaft is stopped. The storage unit stores ta as acceleration time during which the motor output shaft is accelerated in the positioning time, stores tc as constant speed time in which the motor output shaft is rotated at a constant speed in the positioning time, stores td as deceleration time in which the motor output shaft is decelerated in the positioning time, stores tb as the stop time, and stores maximum output torque T for each motor which each of the motor can output, dynamic friction torque Ti, and constant load torque Tm by the load. And the calculation unit performs effective torque calculation in a case of calculating effective torque. The effective torque calculation includes: reading the maximum output torque T, the dynamic friction torque Ti, the constant load torque Tm, the acceleration time ta, the constant speed time tc, the deceleration time td, and the stop time tb which are stored in the storage unit, calculating torque in the acceleration time as Ta which is a sum of the maximum output torque T, the dynamic friction torque Ti, and the constant load torque Tm, calculating torque in the constant speed time as Tc which is a sum of the dynamic friction torque Ti and the constant load torque Tm, calculating torque in the deceleration time as Td which is the sum of the maximum output torque T, the dynamic friction torque Ti, and the constant load torque Tm by the load, calculating torque in the stop time with the constant load torque Tm as Tb, and calculating the effective torque Te by giving the acquired torque Ta, Tc, Td, and Tb, the acceleration time ta, the constant speed time tc, the deceleration time td, and the stop time tb to the following formula (1).

$$Te = \sqrt{\frac{ta \cdot Ta^2 + tc \cdot Tc^2 + td \cdot Td^2 + tb \cdot Tb^2}{tp}} \quad (1)$$

In this motor selection device, dynamic friction torque becomes force impedimental to a rotation of a motor in acceleration time and constant speed time of the motor. Thus, effective torque increases by an amount of the dynamic friction torque. Then, in the deceleration time, the dynamic friction torque becomes force which helps the motor to stop. Thus, effective torque decreases by an amount of the dynamic friction torque. Then, in the motor selection device, constant load torque is added to output torque so that the constant load torque works consistently to increase torque regardless of behavior of the motor. Thus, the motor selection device can calculate effective torque closer to an actual state based on an operation pattern, constant load torque, and friction torque.

According to another aspect of the invention, the motor selection device further includes an input access unit configured to perform input reception processing of information of a simulation condition, the simulation condition including, as an operation condition, an input value of a positioning angle and an input value of a moment of inertia of a load and including, as a requested condition, at least one of an input value of requested positioning time and an input value of requested stop time. The storage unit stores mechanical elements data information and the information of the simulation condition of each selectable motor. The calculation unit calculates the effective torque based on the acceleration time, the constant speed time, the deceleration time, and the stop time in the simulation condition of each motor stored in the storage unit, simulates an operation pattern with shortest positioning time which can be realized with the effective torque, compares the acquired operation pattern of each motor with the operation condition and the requested condition, compares with a predetermined threshold in each item of the operation condition and the requested condition, and calculates an comprehensive determination result according to the acquired adaptable item.

With this configuration, it is possible to estimate a motor with an optimal operation pattern among a plurality of selectable motors based on an comprehensive determination result. Accordingly, it is possible to consider a motor operation pattern after narrowing down target of the motor. Thus, it is possible to reduce a possibility of selecting a motor having an excessive performance.

According to further aspect of the invention, the motor selection device further includes an information output unit configured to link the comprehensive determination result to each motor and to output information of a list of the motor, wherein the input access unit can receive selection of one motor through the list of the motor.

According to this mode, it is possible to support a worker to grasp a choice of an adaptable motor at a glance. An operator can leave a motor as a choice even when the motor does not satisfy a condition. Since the motor, which is not adaptable in an item of the operation condition, is removed, it is possible to remove an unusable motor from the choice and to narrow down the target of the motor. Thus, since a motor operation pattern can be considered by reconsideration of an operation pattern performed by the user, it is possible to reduce a possibility of selecting a motor having excessive performance.

According to still further aspect of the invention, in the case where an item of the operation condition is adaptable and an item of the requested condition is not adaptable, the calculation unit gives a determination result indicating partially adaptable as the comprehensive determination result, and the information output unit outputs information including the determination result indicating partially adaptable in the list of the motor.

According to this mode, an operator can leave the motor as a choice even when the motor does not satisfy the condition. Since the motor which is not adaptable in an item of the operation condition is removed, it is possible to remove an unusable motor from a choice and to narrow down the target of the motor. Thus, since a motor operation pattern can be considered by reconsideration of an operation pattern performed by the user, it is possible to reduce a possibility of selecting a motor having excessive performance. Also, it is possible to support a worker to grasp a choice of an adaptable motor at a glance.

According to the present invention, it is possible to provide a motor selection device which can provide information of effective torque approximate to actual effective torque.

BRIEF DESCRIPTION OF THE DRAWINGS

FIG. 5 is an explanatory diagram illustrating an example of an input screen of the motor selection device according to the present embodiment.

FIG. 10 is an explanatory diagram illustrating an example of a motor database storing mechanical elements data information of each selectable motor according to the present embodiment.

FIG. 20 is an explanatory diagram of an output display screen displaying an example of items compared in the step of comparison with an operation condition and a requested condition and an example of determination results.

FIG. 21 is an explanatory diagram of an output display screen displaying an example of an comprehensive determination result.

DETAILED DESCRIPTION OF THE PREFERRED EMBODIMENT

A mode to carry out the present invention (embodiment) will be described in detail with reference to the drawings. The present invention is not limited to contents described in the following embodiment. Also, configuration elements described in the following include what can be easily assumed by those skilled in the art and what is substantially identical. Also, the configuration elements described in the following can be arbitrarily combined. Also, a device, system, method, and modification example described in the embodiment can be arbitrarily combined within the scope apparent to those skilled in the art.

Figure 1:
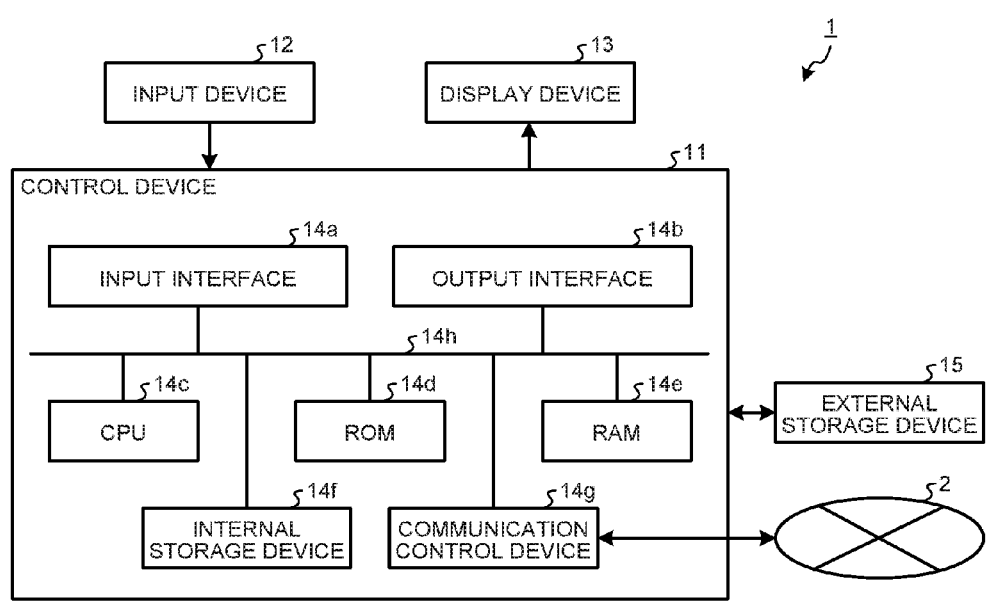
FIG. 1 is a view illustrating a configuration of a motor selection device according to the present embodiment.

FIG. 1 is a view illustrating a configuration of a motor selection device according to the present embodiment. As illustrated in FIG. 1, a motor selection device 1 includes a control device 11, an input device 12, a display device 13, and an external storage device 15. In the motor selection device 1, a communication control device 14g of the control device 11 can be connected to a network 2.

The input device 12 is, for example, a mouse or a keyboard and is an input access unit to receive input operation or selection operation, which is performed by a designer who is a user, and to output an input signal to the control device 11. The display device 13 is a device to display an image such as a cathode ray tube (CRT) or a liquid crystal display and is an information output unit.

The control device 11 is a computer such as a personal computer (PC) or a server system and includes an input interface 14a, an output interface 14b, a central processing unit (CPU) 14c, a read only memory (ROM) 14d, a random access memory (RAM) 14e, an internal storage device 14f, the communication control device 14g, and an inner bus 14h. The input interface 14a, the output interface 14b, the CPU 14c, the ROM 14d, the RAM 14e, the internal storage device 14f, and the communication control device 14g are connected to each other via the inner bus 14h.

The input interface 14a receives an input signal from the input device 12 and outputs the input signal to the CPU 14c. The output interface 14b receives an image signal from the CPU 14c and outputs the image signal to the display device 13.

The ROM 14d stores a program such as a basic input output system (BIOS). The internal storage device 14f is, for example, a hard disk drive (HDD) or a flash memory and stores an operating system program, an application program, and optimal operation pattern selection program for a motor according to the present embodiment. The CPU 14c is a calculation unit and realizes various functions by executing the programs stored in the ROM 14d or the internal storage device 14f while using the RAM 14e as a work area.

The external storage device 15 is an HDD, a server, or the like. In the internal storage device 14f or the external storage device 15, a motor database storing mechanical elements data information of each selectable motor is stored. In the mechanical elements data information includes, for each of the selectable motors, information including a rotor inertia moment, the rotational speed-torque characteristic (N-T characteristic), rated torque, seal friction torque, a maximum rotational speed (maximum rotational angular speed), a break point speed, and maximum output torque, which are linked one another. In such a manner, the internal storage device 14f or the external storage device 15 functions as a storage unit. Note that the rotational speed-torque characteristic (N-T characteristic) may be stored, as data of a rotational angular speed-torque characteristic, into the internal storage device 14f or the external storage device 15.

Figure 2:
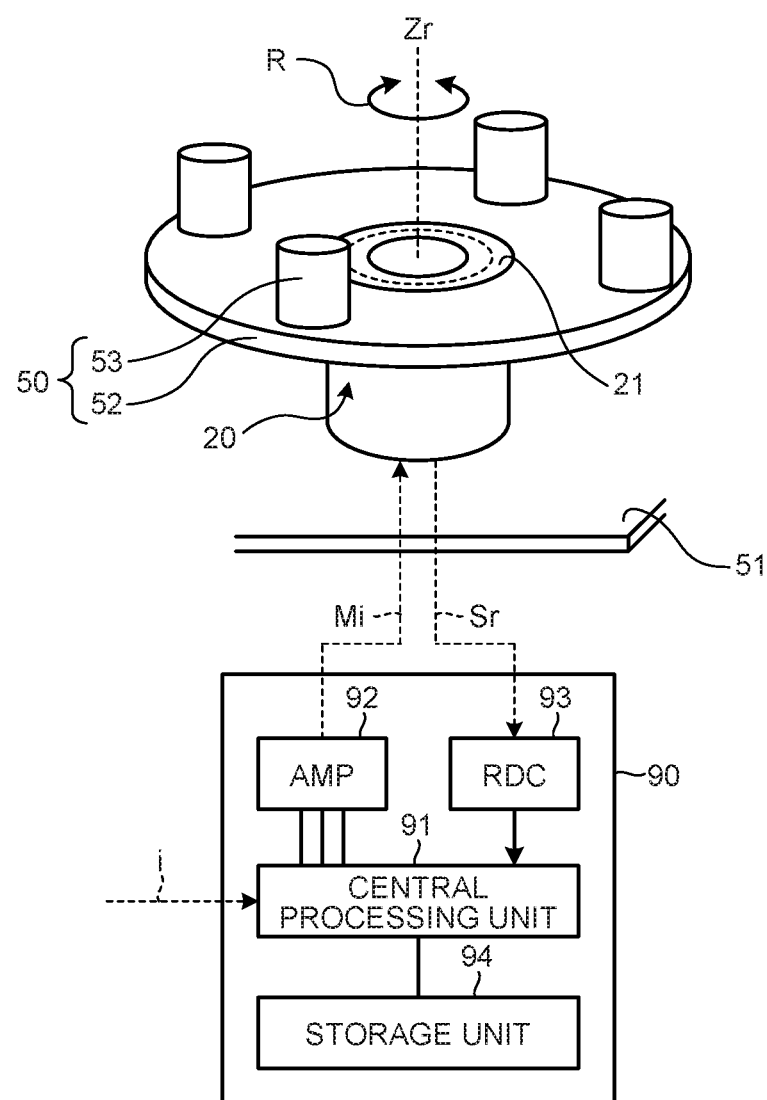
FIG. 2 is an explanatory diagram for describing a utilization state of a motor according to the present embodiment.

FIG. 2 is an explanatory diagram for illustrating a utilization state of a motor according to the present embodiment. As illustrated in FIG. 2, a motor 20 is fixed to a supporting member 51 and is used with a conveying plate 52 to move a conveyed object 53, or the like being attached thereto as a load 50 in such a manner that a normal or reverse rotation can be performed in an R direction around a rotary shaft Zr. For example, the conveyed object 53 is a component such as a light emitting diode, a ceramic capacitor, a chip resistor, or an in-vehicle integrated circuit.

According to a position of a motor output shaft 21, the motor 20 positions the conveyed object 53 transferred by the conveying plate 52. In such a manner, the motor 20 can rotate the conveyed object 53 by directly transmitting rotational force to the conveyed object 53 and the conveying plate 52, which are the load 50, without interposing a transmission mechanism such as a gear, a belt, or a roller therebetween. The motor 20 is a so-called direct drive motor which directly connects a motor rotary shaft and the load 50. Accordingly, the motor 20 can position the conveyed object 53 accurately.

As illustrated in FIG. 2, in the case where a motor rotation instruction i is input from an external computer, a motor control circuit 90 outputs a drive signal to a three-phase amplifier (AMP) 92 from a central processing unit (CPU) 91 according to an operation pattern stored in a storage unit 94. The motor control circuit 90 supplies a driving current Mi to the motor 20 from the AMP 92 through a wiring line. The motor 20 rotates the conveying plate 52 by the driving current Mi and moves the conveyed object 53. In the case where the conveying plate 52 is rotated, a detection signal (resolver signal) Sr is output from a rotational angle detector, such as a resolver, which detects a rotational angle. The motor control circuit 90 receives the detection signal Sr and performs digital conversion of the received detection signal Sr with a resolver to digital converter (RDC) 93. Based on the digital information of the detection signal Sr from the RDC 93, the CPU 91 determines whether the conveyed object 53 reaches an instructed position. In the case where the object 53 reaches the instructed position, transmission of the drive signal to the AMP 92 is stopped.

Figure 3:
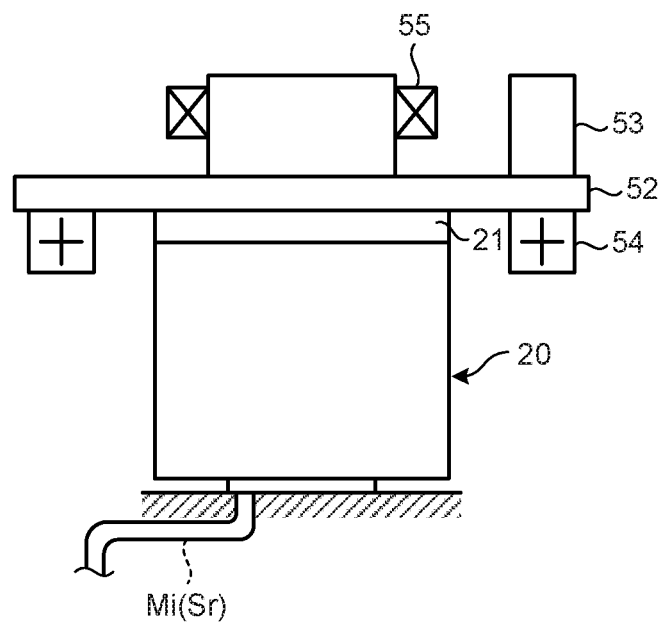
FIG. 3 is an explanatory diagram for describing a component attached to the motor according to the present embodiment.

As illustrated in FIG. 2, a moment of inertia of the load 50 is added to the motor output shaft 21 of the motor 20 according to the number of conveyed objects 53, a shape, weight, and a size thereof and a shape, weight, and a size of the conveying plate 52. The moment of inertia of the load 50 is the sum of the moment of inertia of the load attached to the motor 20. Since the moment of inertia of the load has an influence on an acceleration/deceleration characteristics, it is necessary to consider the moment of inertia of the load 50 in selection of a motor operation pattern and selection of a motor. Also, FIG. 3 is an explanatory diagram for illustrating a component attached to the motor according to the present embodiment. As illustrated in FIG. 3, there is a case where a bearing 54, which supports the conveying plate 52, and an oil seal 55 are attached to the motor 20 other than the conveying plate 52 and the conveyed object 53 and there is a case where dynamic friction torque is generated in the motor output shaft 21 of the motor 20.

Generally, an operation pattern is different depending on a purpose of use of a motor. For example, at least one of the following is required for an operation pattern. That is, rotational time of the motor is the shortest, stop time necessary for the motor is the shortest, effective torque of the motor is the lowest, acceleration/deceleration is as high as possible, and a rotational speed (rotational angular speed) is equal to or lower than a constant speed.

A user of a motor may not familiar with a motor to be selected. Even when the user calculates an operation pattern by himself/herself, it may be tough for the user to verify whether a result of the calculated operation pattern is an optimal operation pattern for the selected motor. Also, it may be tough for the user of the motor to perform adjustment in such a manner that the result of the calculated operation pattern becomes the optimal operation pattern of the selected motor. Thus, the user of the motor may select a motor having an excessive performance to reduce the toughness and a cost of the motor may increase.

Figure 4:
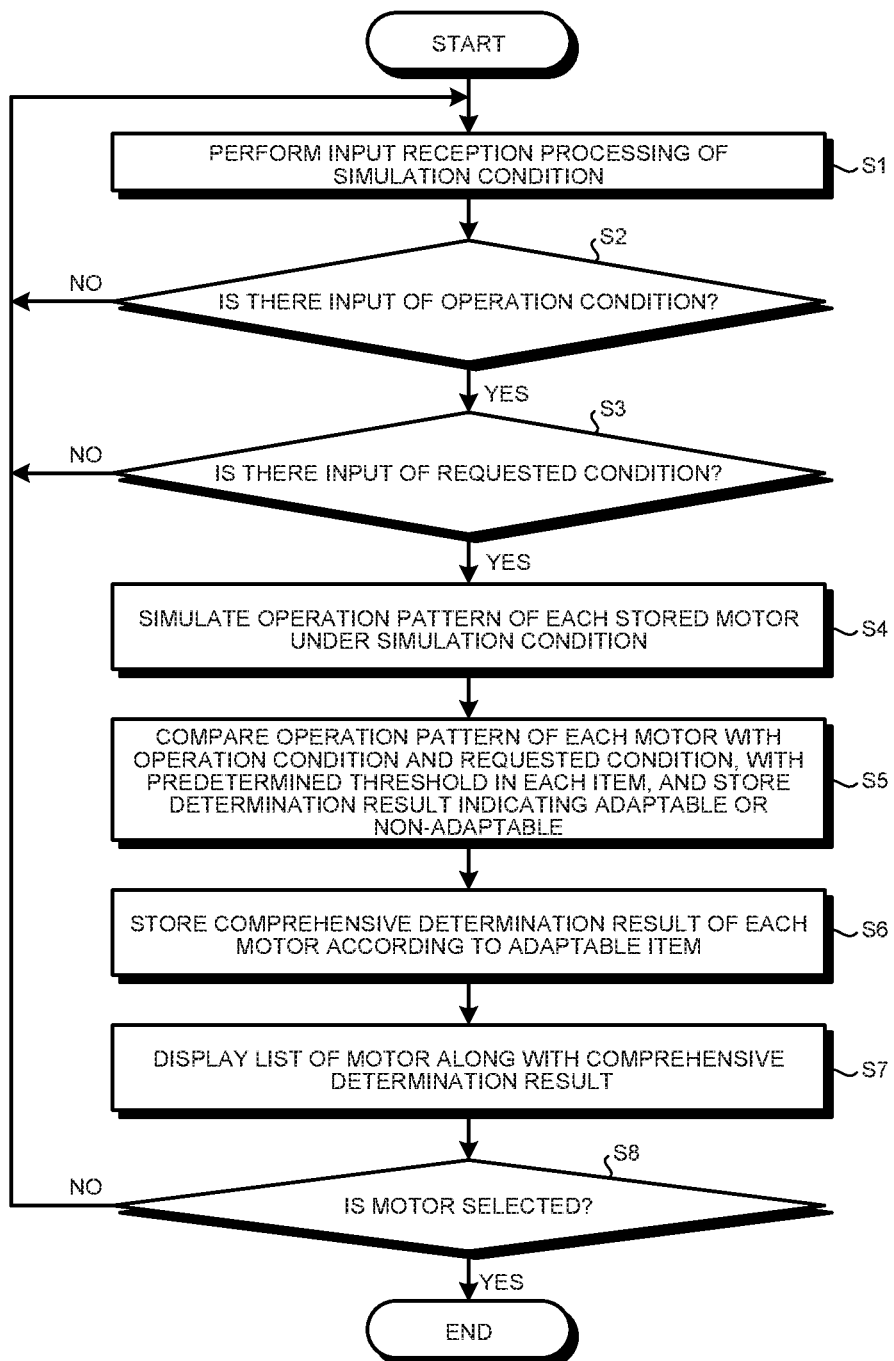
FIG. 4 is a flowchart illustrating an example of a processing procedure of a motor optimal operation pattern selection method executed by the motor selection device according to the present embodiment.

Thus, the motor selection device of the present embodiment executes the optimal operation pattern selection program for a motor illustrated in FIG. 4 and performs a motor optimal operation pattern selection method. FIG. 4 is a flowchart illustrating an example of a processing procedure of the motor optimal operation pattern selection method executed by the motor selection device according to the present embodiment.

First, the control device 11 of the motor selection device 1 performs input reception processing of a simulation condition and executes an input step of a simulation condition in which step information of a simulation condition is acquired (step S1). FIG. 5 is an explanatory diagram illustrating an example of an input screen of the motor selection device according to the present embodiment. As illustrated in FIG. 5, the display device 13 presents an input screen G1 to a user. The CPU 14c of the control device 11 receives each input value in a box B1 of a first condition among simulation conditions input from the input device 12. For example, the CPU 14c can receive an input value C11 of a positioning angle, an input value C12 of requested positioning time, an input value C13 of requested stop time, an input value C14 of a torque limit, and an input value C15 of a maximum rotational speed limit which are input from the input device 12 and stores, as information of the simulation condition, the received input values into the external storage device 15 or the internal storage device 14f.

Similarly, the CPU 14c of the control device 11 receives each input value in a box B2 of a second condition illustrated in FIG. 5 among the simulation conditions input from the input device 12. For example, the CPU 14c receives one or more of an input value C21 of a moment of inertia of a load, an input value C22 of load torque (constant), and an input value C23 of dynamic friction torque which are input from the input device 12 and stores the received input values, as information of the simulation condition, into the external storage device 15 or the internal storage device 14f.

Figure 6:
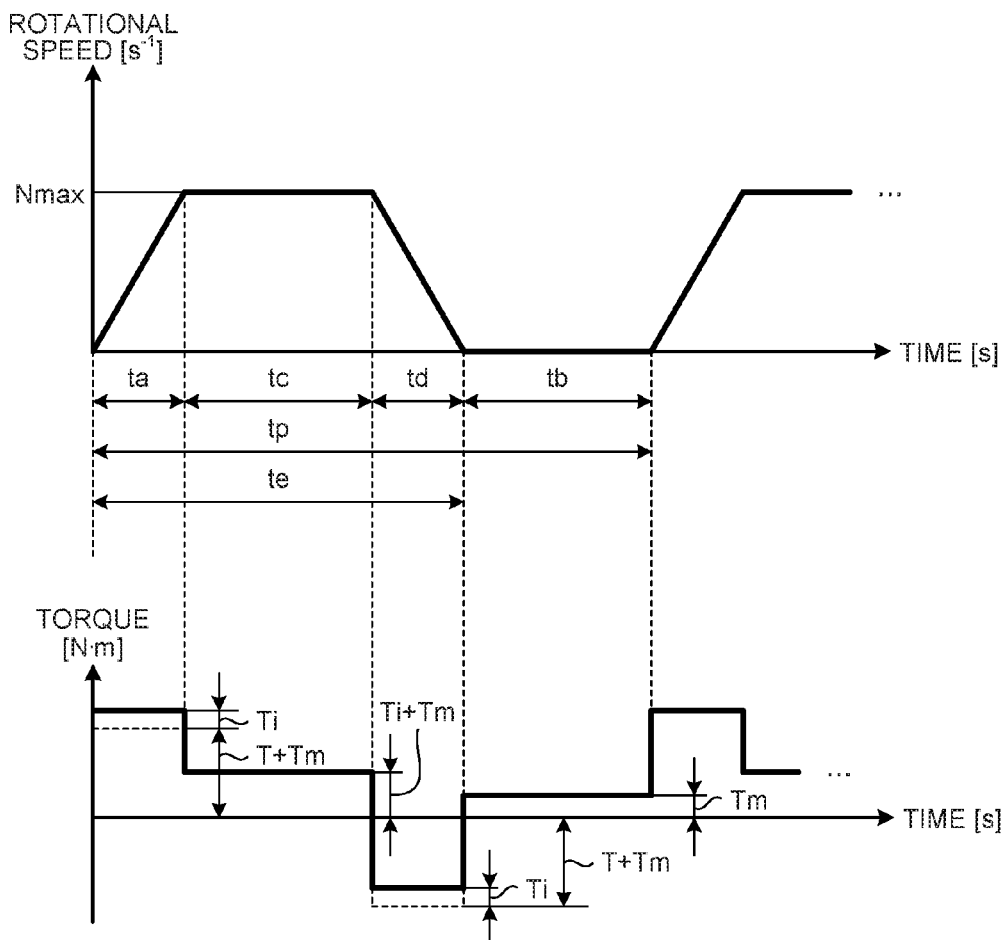
FIG. 6 is an explanatory diagram for describing an example of a motor operation pattern according to the present embodiment.

FIG. 6 is an explanatory diagram for illustrating an example of a motor operation pattern according to the present embodiment. In the operation pattern illustrated in FIG. 6, the rotational speed of the motor increases to be accelerated during acceleration time ta. Next, in the operation pattern illustrated in FIG. 6, a rotational speed of the motor is kept at the maximum rotational speed Nmax during constant speed time tc. Next, in the operation pattern illustrated in FIG. 6, the rotational speed of the motor decreases to be decelerated during deceleration time td. Next, in the operation pattern illustrated in FIG. 6, the rotational speed of the motor becomes 0 and the motor stops during stop time tb. Positioning time te is the sum of the acceleration time ta, the constant speed time tc, and the deceleration time td. The above-described input value C12 of requested positioning time corresponds to the value of the positioning time te. Also, the input value C13 of requested stop time corresponds to the stop time tb. Then, the input value C15 of the maximum rotational speed limit corresponds to the value of the maximum rotational speed Nmax.

Figure 7:
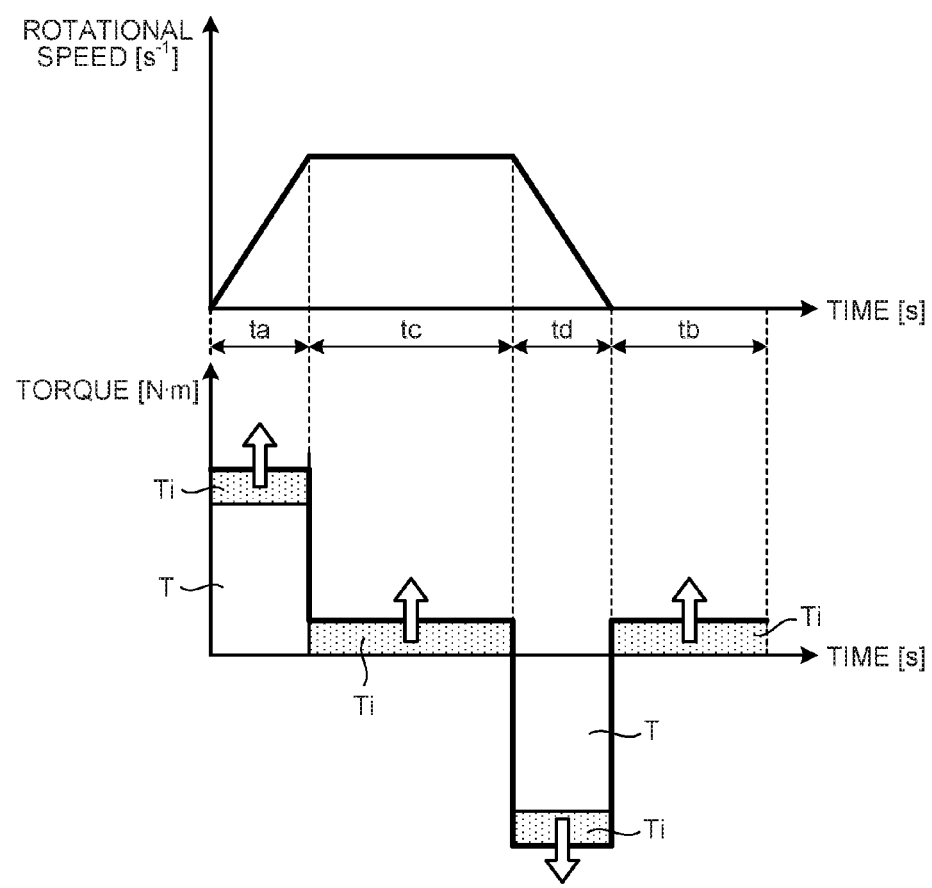
FIG. 7 is an explanatory diagram illustrating an example of a relation between output torque of in the case where there is no dynamic friction torque and output torque of when there is dynamic friction torque.
Figure 8:
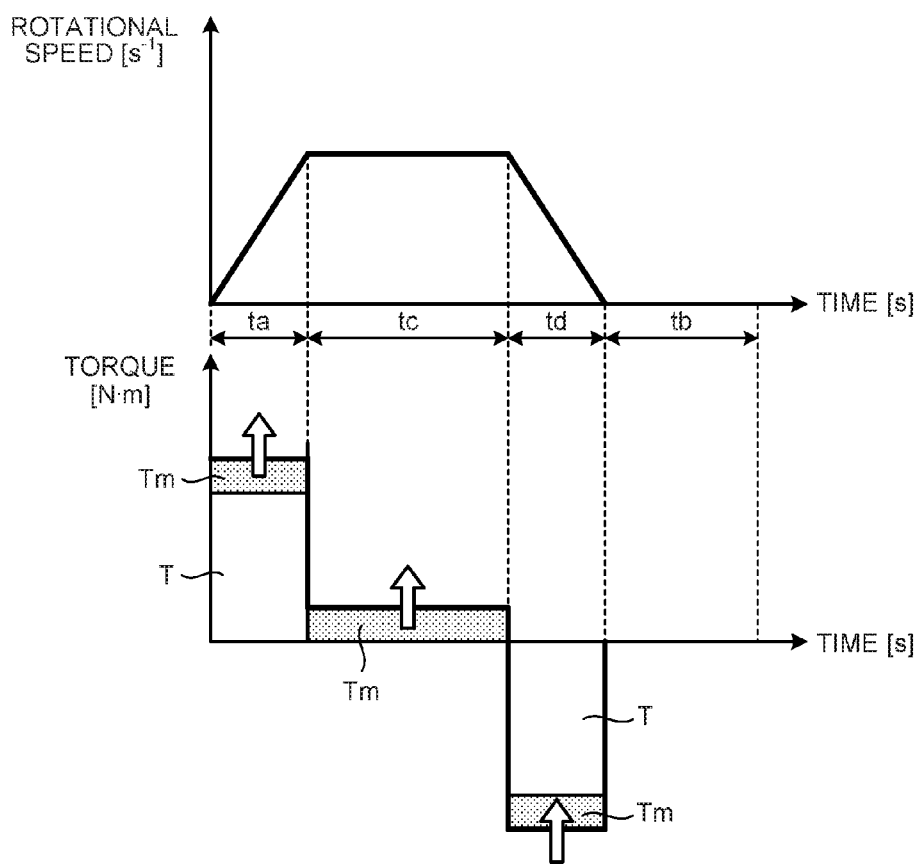
FIG. 8 is an explanatory diagram illustrating an example of a relation between output torque of when there is no constant load torque and output torque of when there is constant load torque.

As the operation pattern illustrated in FIG. 6, in most cases, the direct drive motor performs positioning operation by alternately setting the positioning time to rotate the motor output shaft 21 and the stop time to stop the motor output shaft 21. According to the operation pattern illustrated in FIG. 6, different from the case where the motor is used at a constant rotational speed and constant load torque, it is necessary to consider how constant load torque Tm and dynamic friction torque Ti influence output torque in accordance with behavior of the motor at the time of calculating effective torque Te. FIG. 7 is an explanatory diagram illustrating an example of a relation between output torque of in the case where there is no dynamic friction torque and output torque of in the case where there is dynamic friction torque. FIG. 8 is an explanatory diagram illustrating an example of a relation between output torque of in the case where there is no constant load torque and output torque of in the case where there is constant load torque.

For example, in Prior Art 1 described above, dynamic friction torque Ti is added to output torque T in a normal rotation and dynamic friction torque Ti is subtracted from the output torque T in a reverse rotation. However, in the case where an actual physical phenomenon is considered, the dynamic friction torque Ti becomes force impedimental to the rotation of the motor during the acceleration time ta and the constant speed time tc of the motor. Thus, the effective torque Te illustrated in FIG. 6 increases by an amount of the dynamic friction torque Ti during the period obtained by adding the acceleration time ta with the constant speed time tc and deceleration time td illustrated in FIG. 7. In the deceleration time td, the dynamic friction torque Ti is force which helps the motor to stop. As a result, the effective torque Te decreases by an amount of the dynamic friction torque Ti. Then, as illustrated in FIG. 8, it can be understood that the constant load torque Tm works consistently to increase torque regardless of behavior of the motor.

As illustrated in FIG. 5, the above-described input value C14 of the torque limit is a ratio of limiting the maximum output torque, and is a percentage figure in the case of assuming that the maximum output torque is 100, for example. More specifically, in the case where the motor has the maximum torque of 100 N and the input value C14 of the torque limit is 70(%), the CPU 14c executes simulation under the maximum torque of 70 N. By thus limiting the maximum torque, there may be a case where the positioning time te is elongated while a cycle period tp obtained by adding the positioning time te with the stop time tb can be shortened. Further, the input value C22 of the load torque (constant) corresponds to the constant load torque Tm. Further, the input value C23 of the dynamic friction torque corresponds to a value of the dynamic friction torque Ti.

Therefore, the CPU 14c reads the input value C11 of the positioning angle, input value C12 of the required positioning time, input value C13 of the required stop time, input value C14 of the torque limit, and input value C15 of the maximum rotational speed limit, which are input from the input device 12 to store the values C11 to C15 in the external storage device 15 or the internal storage device 14f. In the same manner, the CPU 14c of the control device 11 reads the input value C21 of the inertia moment of the load, input value C22 of the load torque (constant), and input value C23 of the dynamic friction torque, to store in the external storage device 15 or the internal storage device 14f.

As described above, in the case where the torque during the acceleration time ta in the operation pattern illustrated in FIG. 6 is set at torque Ta, the torque Ta is calculated by a formula (2) below in the CPU 14c.

$$Ta = T + Tm + Ti \tag{2}$$

Further, in the case where the torque during the constant speed time tc in the operation pattern illustrated in FIG. 6 is set at torque Tc, the torque Tc is calculated by a formula (3) below in the CPU 14c.

$$Tc = Tm + Ti \tag{3}$$

Further, in the case where the torque during the deceleration time td in the operation pattern illustrated in FIG. 6 is set at torque Td, the torque Td is calculated by a formula (4) below in the CPU 14c.

$$Td = T + Tm - Ti \tag{4}$$

Further, in the case where the torque during the stop time tb in the operation pattern illustrated in FIG. 6 is set at torque Tb, the torque Tb is calculated by a formula (5) below in the CPU 14c. Note that the torque Tb is the torque to keep a stopped position during the stop time tb.

$$Tb = Tm \quad (5)$$

Figure 9:
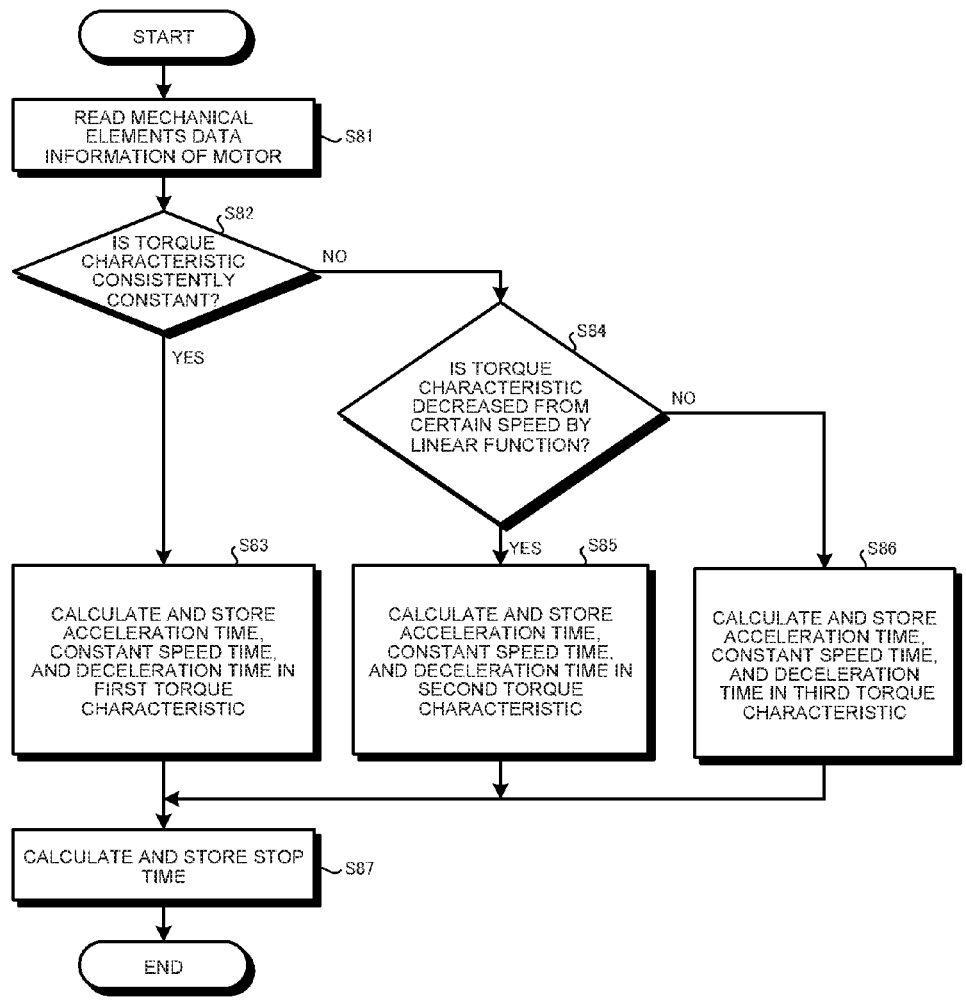
FIG. 9 is an explanatory diagram illustrating an example of a flowchart of a calculation of the motor operation pattern according to the present embodiment.

FIG. 9 is an explanatory diagram illustrating an example of a flowchart of a calculation of the motor operation pattern according to the present embodiment. FIG. 10 is an explanatory diagram illustrating an example of the motor database storing mechanical elements data information of each selectable motor according to the present embodiment. The CPU 14c can calculate, for each of the motors, the acceleration time ta, constant speed time tc, and deceleration time td by the flowchart illustrated in FIG. 9 based on the above-described input value C21 of the moment of inertia of the load, input value C11 of the positioning angle, and information of at least the moment of inertia of the rotor and the rotational speed-torque characteristic (N-T characteristic) among the mechanical elements data information DB.

As illustrated in FIG. 9, the CPU 14c reads the information of the mechanical elements data information for each of the selectable motor described above (Step S81). The mechanical elements data information DB illustrated in FIG. 10 includes, for each call number (motor index) of each of the selectable motors listed in a column BN, information including rotor inertia moment information DJI, rotational speed-torque characteristic (N-T characteristic) information DNT, rated torque information DRT, seal friction torque information DST, maximum rotational speed (maximum rotational angular speed) information DNmax, break point speed (or rotational speed) information Dbk, and maximum output torque information DMT which are linked one another. In the mechanical elements data information DB of the present embodiment, torque characteristic information DNTK related to a coefficient a and a coefficient b, which indicate later-described torque characteristics of torque decrease after the break point, is linked to and stored in the column BN for the call number (motor index) of each of the selectable motors in the case where there is a break point at which torque decreases by the rotational angular speed of rotation of the motor output shaft in the torque characteristic information (N-T characteristic) DNT. The CPU 14c may obtain, on a case-by-case basis, the torque characteristic information DNTK by performing calculation from the rotational speed-torque characteristic (N-T characteristic) information DNT. Note that the mechanical elements data information DB illustrated in FIG. 10 includes a column BS to store information of series names of the selectable motors grouped by types in the column BN.

Figure 11:
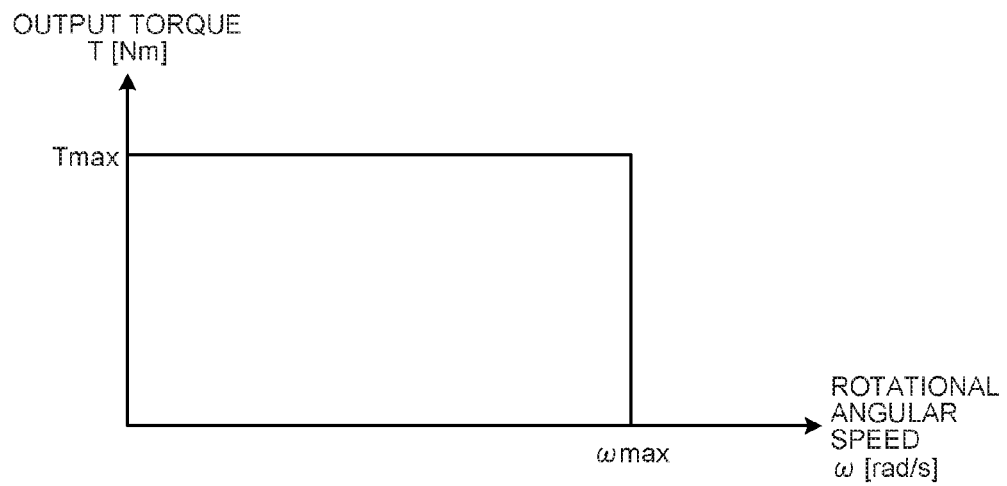
FIG. 11 is an explanatory diagram illustrating a first torque characteristic information (N-T characteristic) in the motor according to the present embodiment.
Figure 12:
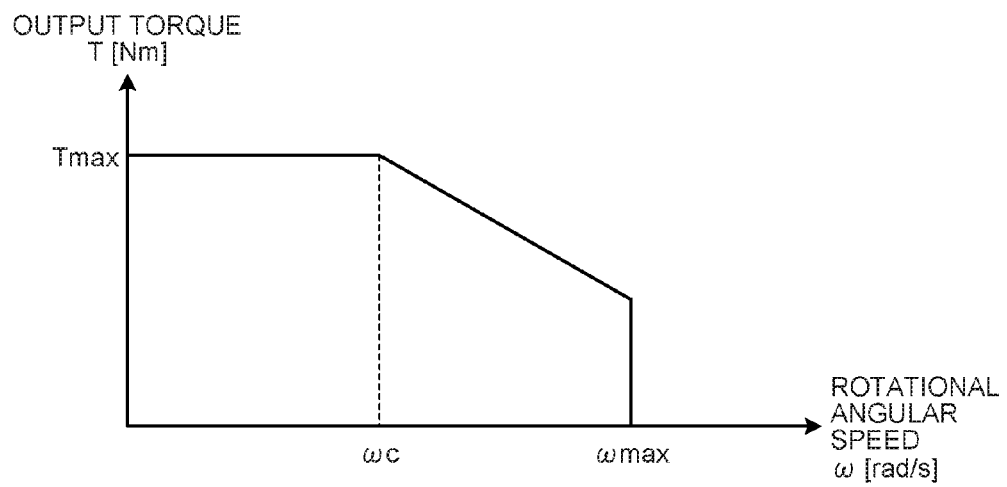
FIG. 12 is an explanatory diagram illustrating a second torque characteristic information (N-T characteristic) in the motor according to the present embodiment.
Figure 13:
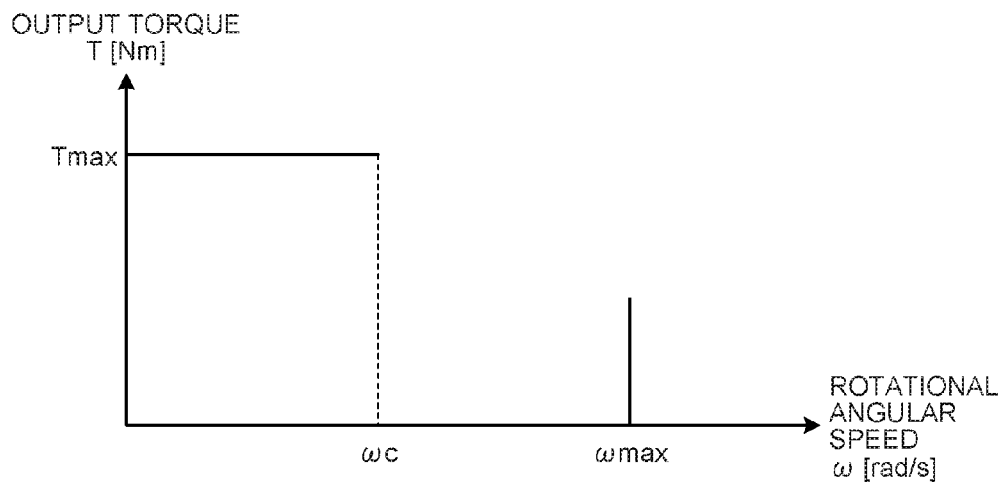
FIG. 13 is an explanatory diagram illustrating a third torque characteristic information (N-T characteristic) in the motor according to the present embodiment.

Then, the CPU 14c calculates, as information of a simulation condition, the acceleration time ta, the constant speed time tb, and the deceleration time td to be positioning time based on the input value C21 of a moment of inertia of a load, the input value C11 of a positioning angle, and the mechanical elements data information DB. FIG. 11 is an explanatory diagram illustrating a first torque characteristic information (N-T characteristic) in the motor according to the present embodiment. FIG. 12 is an explanatory diagram illustrating a second torque characteristic information (N-T characteristic) in the motor according to the present embodiment. FIG. 13 is an explanatory diagram illustrating a third torque characteristic information (N-T characteristic) in the motor according to the present embodiment. In the following, an example of a calculation by the CPU 14c will be described with exemplification of the first torque characteristic information (N-T characteristic), the second torque characteristic information (N-T characteristic), and third torque characteristic information (N-T characteristic) which are respectively illustrated in FIG. 11, FIG. 12, and FIG. 13. However, the present embodiment is not limited to this calculation example. Also, in the present embodiment, a calculation example will be described on the assumption that the acceleration time ta and the deceleration time td are equal to each other in order to reduce a calculation load. However, a calculation may be performed in such a manner that the acceleration time ta and the deceleration time td are different from each other.

The rotational speed-torque characteristic (N-T characteristic) is information of torque with respect to the number of rotations of each stored motor. Since a rotational angular speed $\omega$ is $2\pi N$ which is the number of rotations N multiplied by $2\pi$, a characteristic same as the rotational angular speed-torque characteristic is included. In the case where the stored mechanical elements data information DB includes the rotational speed-torque characteristic (N-T characteristic), the CPU 14c calculates information of the number of rotations, or of the rotational speed, as a rotational angular speed and converts the information into information of torque with respect to the rotational angular speed (rotational angular speed-torque characteristic) illustrated, for example, each of in FIG. 11, FIG. 12, and FIG. 13. In the case where the stored mechanical elements data information DB includes a rotational angular speed-torque characteristic, the CPU 14c can directly reads, from the storage unit, information of the rotational angular speed-torque characteristic illustrated in each of FIG. 11, FIG. 12, and FIG. 13. In the case where information DNmax of the maximum rotational speed Nmax is included in the mechanical elements data information DB, the CPU 14c sets, as the maximum rotational angular speed $\omega$max, $2\pi$Nmax which is the information of the maximum rotational speed Nmax multiplied by $2\pi$. Also, in the case where the information of the maximum rotational angular speed $\omega$max is included in the mechanical elements data information DB, the CPU 14c can directly read the information of the maximum rotational angular speed $\omega$max from the storage unit. In the case where the information of the maximum rotational speed Nmax is not included in the mechanical elements data information DB, the CPU 14c may calculate the information of the maximum rotational speed Nmax from the rotational speed-torque characteristic (N-T characteristic) and may set, as the maximum rotational angular speed $\omega$max, $2\pi$Nmax which is the maximum rotational speed Nmax multiplied by $2\pi$.

(Information of First Torque Characteristic (N-T Characteristic))

For example, in the case where the rotational speed-torque characteristic (N-T characteristic) of a selected motor is the first torque characteristic information (N-T characteristic) in which torque is constant with respect to the number of rotations or the rotational speed (step S82, Yes), the CPU 14c calculates acceleration time ta, constant speed time tb, and deceleration time td of each motor. Then, the CPU 14c calculates positioning time te as a summed value of the acceleration time ta, the constant speed time tb, and the deceleration time td.

As illustrated in FIG. 11, in the first torque characteristic information (N-T characteristic), where a horizontal axis indicates the rotational angular speed and a vertical axis indicates the output torque, there is no break point at which the torque decreases in relation to the rotational angular speed of the rotation of the motor output shaft. In the case where information of the break point speed is not included in the mechanical elements data information DB or in the case where there is no break point based on information of a break point Dbk, the CPU 14c determines that the read rotational speed-torque characteristic (N-T characteristic) of the motor is the first torque characteristic information (N-T characteristic). There is no break point in the first torque characteristic information (N-T characteristic). Thus, in a region where the rotational angular speed ω of the motor output shaft is from a rotational angular speed 0 to the maximum rotational angular speed ωmax (rad/s), the output torque T is constant regardless of the speed of the motor output shaft.

The CPU 14c calculates a summed value J (kg·m$^2$) of the rotor inertia moment included in the read mechanical elements data information DB, and the input value C21 of the moment of inertia of the load. In the case where the CPU 14c assumes that rotational angular acceleration is α (rad/s$^2$), a relation between the above summed value J (kg·m$^2$) and the output torque T is expressed by the formula (6) according to a motion equation.

$$T = \alpha \times J \quad (6)$$

The rotation angular acceleration α can be obtained as shown in a formula (7) based on the formula (6).

$$\alpha = \frac{T}{J} \quad (7)$$

Since constant angular acceleration is assumed in the simulation of the present embodiment, the rotational angular speed ω is expressed as shown in a formula (8) below.

$$\omega = \alpha \times ta \quad (8)$$

In the present embodiment, in the first torque characteristic information (N-T characteristic), the torque is constant with respect to the rotational angular speed. For example, in order to make the positioning time te as short as possible under the condition that the acceleration time ta and the deceleration time td are equal to each other, it is only necessary to bring the constant speed time tc into 0. Thus, in the case where the input value C11 of the positioning angle is an angle θ, the angle θ (rad) can be calculated by the following formula (9).

$$\theta = \omega ta = \alpha \times ta^2 \quad (9)$$

Therefore, the acceleration time ta can be calculated as shown in a formula (10) based on the formulas (9) and (7).

$$ta = \sqrt{\frac{\theta}{\alpha}} = \sqrt{\frac{J\theta}{T}} \quad (10)$$

In the case of acquiring the positioning time te under the condition that the acceleration time ta is equal to the deceleration time td, the positioning time te can be obtained from calculation of a formula (11) below.

$$te = 2ta = 2\sqrt{\frac{J\theta}{T}} \quad (11)$$

As described above, in the simulation step (step S4), the CPU 14c calculates a summed value J of the moment of inertia by adding the information of the rotor inertia moment DJI, which is in the mechanical elements data information DB, and the input value C21 of the moment of inertia of the load to each other. Then, the CPU 14c calculates the shortest positioning time in which the load is rotated only by the input value C11 of the positioning angle θ based on the information of the torque characteristic DNT, included in the mechanical elements data information DB, corresponding to the rotational angular speed or the number of rotations, and the summed value J of the moment of inertia. Accordingly, it is possible to simulate the operation pattern with which it is possible to reduce time spent until positioning is completed as much as possible to shorten a cycle time. In the case where the output torque T is constant until the rotation of the motor output shaft reaches the maximum rotational angular speed or the maximum number of rotations from 0 in the information of the torque characteristic DNT corresponding to the rotational angular speed or the number of rotations of a stored motor, the CPU 14c simulates an operation pattern in such a manner that the motor output shaft is rotated by the positioning angle θ in the acceleration time ta to accelerate the rotation of the motor output shaft and the deceleration time td to decelerate the rotation of the motor output shaft. Then, the CPU 14c calculates the acceleration time ta and the deceleration time td with respect to a call number (index of motor) of each selectable motor in the column BN by the formula (10), stores calculated values of the acceleration time ta and the deceleration time td into the external storage device 15 or the internal storage device 14f, and stores the value zero as the constant speed time tc into the external storage device 15 or the internal storage device 14f (step S83). Then, after step S83, the CPU 14c performs step S87 in the processing.

For example, in the case where torque is not constant with respect to the number of rotations in the rotational speed-torque characteristic (N-T characteristic) of a selected motor (step S82, No), the CPU 14c performs step S84 in the processing and performs a calculation according to a calculation procedure of the second torque characteristic information (N-T characteristic) or the third torque characteristic information (N-T characteristic). As illustrated in FIG. 12 and FIG. 13, in each of the second torque characteristic information (N-T characteristic) and the third torque characteristic information (N-T characteristic), a horizontal axis indicates a rotational angular speed and a vertical axis indicates output torque. Also, there is a break point ωc which is a change point at which torque starts decreasing at a certain speed of the rotation of the motor output shaft. In the case where there is a break point ωc, the CPU 14c determines that a read torque characteristic (N-T characteristic) with respect to the number of rotations of the motor is the second torque characteristic information (N-T characteristic) or the third torque characteristic information (N-T characteristic), based on the information of a break point Dbk.

(Information of Second Torque Characteristic (N-T Characteristic))

In the case where the information of a torque characteristic corresponding to a rotational angular speed or the number of rotations of the stored motor includes a break point at which output torque decreases, until a rotation of the output shaft reaches the maximum rotational angular speed from 0 or the rotation of the output shaft reaches the maximum number of rotations from 0, a calculation of the positioning time te is changed in a case where the rotational angular speed calculated by the above-described formula (8) is in a first region within which the rotational angular speed is up to the break point of the rotational angular speed or in a second region within which the rotational angular speed is the break point or more and to the maximum rotational angular speed. In the case where the rotational angular speed calculated by the above-described formula (8) is in the first region within which the rotational angular speed is up to the break point of the rotational angular speed, the positioning time te can be acquired by the calculation of the above-described formula (11) performed by the CPU 14c similarly to the calculation of the above-described first torque characteristic information (N-T characteristic). In the following, a calculation of the positioning time te executed by the CPU 14c in a case where the rotational angular speed calculated by the above-described formula (8) is in the second region will be described with reference to FIG. 12. In the second torque characteristic information (N-T characteristic) illustrated in FIG. 12, the output torque T is constant in the case where the rotational angular speed ω of the motor output shaft is in the first region in which the rotational angular speed ω of the motor output shaft is the rotational angular speed 0 or more and the rotational angular speed ω (rad/s) at the break point or less. Also, in the second torque characteristic information (N-T characteristic) illustrated in FIG. 12, in the case where the rotational angular speed ω of the motor output shaft is in the second region in which the rotational angular speed ω of the motor output shaft exceeds the rotational angular speed ωc (rad/s) at the break point and is varied to the maximum rotational angular speed ωmax (rad/s) or less and further in a case where the output torque decreases in a relation of a linear function expressed by formula (12) even in the case where the rotational angular speed ω increases (step S84, Yes), the CPU 14c calculates positioning time te in the second region of the second torque characteristic information (N-T characteristic).

$$T = a\omega + b \quad (12)$$

Each of a coefficient a and a coefficient b expressed in the formula (12) is information read by the CPU 14c from the mechanical elements data information DB and is a real number other than 0. Note that since the coefficient a is negative, the output torque T decreases in a relation of a linear function expressed by the formula (12) even when the rotational angular speed ω increases.

The rotational angular acceleration α can be calculated by formula (13) based on the formula (12) and the formula (6).

$$\alpha = \frac{b}{(J - a \times ta)} \quad (13)$$

The angle θ [rad] is a value which is obtained by integrating the rotational angular speed ω with respect to time. Since the calculation load is reduced on the assumption that the acceleration time ta and the deceleration time td are equal, the angle θ can be calculated by following formula (14) based on the above formula (8).

$$\theta = \omega(ta + tc) = \alpha \times ta(ta + tc) = \alpha \times ta^2 + \alpha \times ta \times tc \quad (14)$$

In the case of sorting out the formula (14) by the constant speed time tc, a formula (15) can be obtained.

$$tc = \frac{\theta}{\alpha \times ta} - ta \quad (15)$$

The positioning time te is time obtained by adding the acceleration time ta, the constant speed time tc, and the deceleration time td. The calculation load decreases on the assumption that the acceleration time ta and the deceleration time td are equal, and the positioning time te can be calculated by a function of the acceleration time ta as expressed by a formula (16).

$$te = ta + tc + td = 2ta + tc = ta + \frac{\theta}{\alpha \times ta} = ta + \frac{J\theta}{b \times ta} - \frac{a \times \theta}{b} \quad (16)$$

To minimize the positioning time te, the CPU 14c differentiates the function of the acceleration time ta shown in the formula (15) with respect to the acceleration time ta, and a positive extreme value of the acceleration time ta can be obtained by a formula (17) in the case of zero.

$$ta = \sqrt{\frac{J\theta}{b}} \quad (17)$$

As described above, in the case where the rotational angular speed ω is in the second region, the CPU 14c calculates the acceleration time ta and the constant speed time tc and stores the calculated time into the external storage device 15 or the internal storage device 14f. Then, the CPU 14c calculates the positioning time in the second region as the summed value of the constant speed time tc and doubled acceleration time ta, and stores the calculated value into the external storage device 15 or the internal storage device 14f.

In the case where the rotational angular speed ω is in the first region, similarly to the above-described first torque characteristic information (N-T characteristic), the CPU 14c calculates the acceleration time ta and the deceleration time td by the formula (10), stores the calculated values of the acceleration time ta and the deceleration time td into the external storage device 15 or the internal storage device 14f, and stores the value zero as the constant speed time tc into the external storage device 15 and the internal storage device 14f. The CPU 14c calculates the positioning time in the first region by the formula (11) and stores the calculated time into the external storage device 15 or the internal storage device 14f. Note that in the first region of the present embodiment, the output torque T of the second torque characteristic information (N-T characteristic) illustrated in FIG. 12 is constant. However, this is not the limited thereto. The output torque T may have characteristic of being increased while rotation of the output shaft is varied from zero to the break point ωc.

The CPU 14c stores the acceleration time ta, the constant speed time tc, and the deceleration time td of the positioning time te which is determined from the positioning time in the first region and the positioning time in the second region, into the external storage device 15 or the internal storage device 14f (step S85). Then, after step S85, the CPU 14c performs step S87 in the processing. In such a manner, in the second region from the break point ωc to the maximum rotational angular speed ωmax, the CPU 14c can perform a simulation in such a manner that the output shaft is rotated by the positioning angle θ in the acceleration time ta, the constant speed time tc, and the deceleration time td (=ta).

(Information of Third Torque Characteristic (N-T Characteristic))

In the case where the information of a torque characteristic corresponding to a rotational angular speed or the number of rotations of the stored motor includes a break point at which output torque decreases, until a rotation of the output shaft reaches the maximum rotational angular speed from 0 or the rotation of the output shaft reaches the maximum number of rotations from 0, a calculation of the positioning time te is changed in a case where the rotational angular speed calculated by the above-described formula (8) is in a first region within which the rotational angular speed is up to the break point of the rotational angular speed or in a second region within which the rotational angular speed is the break point or more and to the maximum rotational angular speed. In the case where the rotational angular speed calculated by the above-described formula (8) is in the first region within which the rotational angular speed is up to the break point of the rotational angular speed, the positioning time te can be acquired by the calculation of the above-described formula (11) performed by the CPU 14c similarly to the calculation of the above-described first torque characteristic information (N-T characteristic). In the following, a calculation of the positioning time te executed by the CPU 14c in a case where the rotational angular speed calculated by the above-described formula (8) is in the second region will be described with reference to FIG. 13. In the third torque characteristic information (N-T characteristic) illustrated in FIG. 13, the output torque T is constant in the case where the rotational angular speed ω of the motor output shaft is in the first region in which the rotational angular speed ω of the motor output shaft is zero or more and the rotational angular speed ωc (rad/s) at the break point or less. Further, in the third torque characteristic information (N-T characteristic) illustrated in FIG. 13, in the case where the rotational angular speed ω of the motor output shaft is in the second region in which the rotational angular speed ω of the motor output shaft exceeds the rotational angular speed ωc (rad/s) at the break point and is varied to the maximum rotational angular speed ωmax (rad/s) or less, and in a case where the output torque T decreases due to a relation of an $n^{th}$-degree function (n is a value larger than 1) although the rotational angular speed ω increases (Step S84, No), the CPU 14c calculates the positioning time te of the motor in the second region of the third torque characteristic information (N-T characteristic).

In the third torque characteristic information (N-T characteristic), in the case where the rotational angular speed ω is in the second region in which the rotational angular speed exceeds the rotational angular speed ωc (rad/s) at the break point and is varied to the maximum rotational angular speed ωmax (rad/s) or less, the output torque decreases in a relation of the $n^{th}$-degree function (n is the value larger than 1) even when the rotational angular speed ω increases. The CPU 14c can perform processing by one or both of a first calculation procedure to perform calculation by performing linear approximation of the $n^{th}$-degree function and a second calculation procedure to calculate the shortest positioning time by dividing the second region into a plurality of sections by a predetermined rotational angular speed and calculating positioning time of each rotational angular speed.

(First Calculation Procedure)

Figure 14:
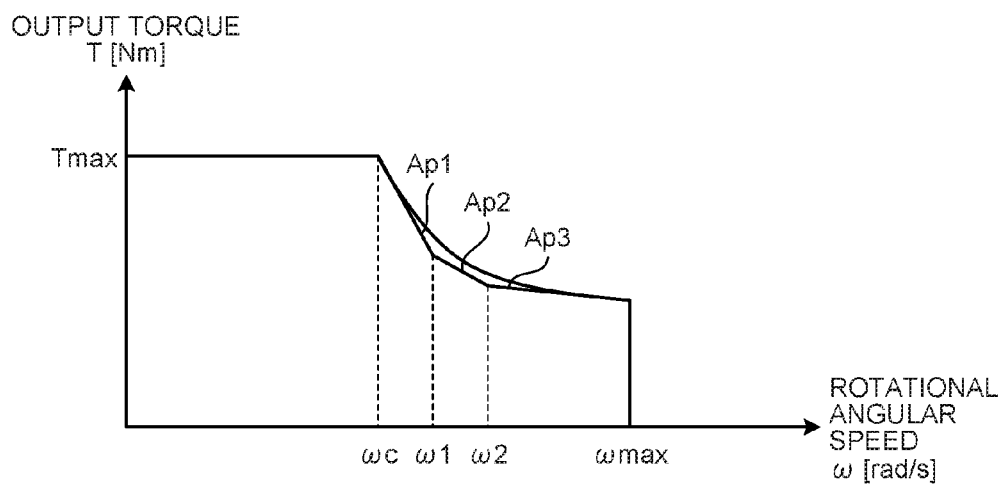
FIG. 14 is an explanatory diagram for describing an approximate formula for a calculation of the shortest positioning time by approximating the third torque characteristic information (N-T characteristic) illustrated in FIG. 13.

FIG. 14 is an explanatory diagram for illustrating an approximate formula for calculation of the shortest positioning time by approximating the third torque characteristic information (N-T characteristic) illustrated in FIG. 13. The CPU 14c approximates an $n^{th}$-degree curve in the second region by a plurality of approximate curves (hereinafter, referred to as approximate straight lines) Ap1, Ap2, and Ap3 each of which is a linear function. The approximate straight lines Ap1, Ap2, and Ap3 have coefficients a and coefficients b which are different from each other. The coefficient a of each of the approximate straight lines Ap1, Ap2, and Ap3 has inclination larger than a tangent line when the rotational angular speed ω is in the $n^{th}$-degree curve in one of the areas in the second region corresponding to the respective approximate straight lines Ap1, Ap2, and Ap3. That is, it is preferable that the coefficient a of each of the approximate straight lines Ap1, Ap2, and Ap3 is smaller than the tangent line of when the rotational angular speed ω is in the $n^{th}$-degree curve in one of the areas in the second region corresponding to the respective straight lines Ap1, Ap2, and Ap3. Accordingly, the approximate straight lines Ap1, Ap2, and Ap3 become smaller than an actual $n^{th}$-degree curve and it becomes possible to reduce a possibility of calculating torque which cannot be output by the motor being calculated.

As described above, the CPU 14c calculates acceleration time ta and constant speed time tc based on the above-described formulas (15) and (17) in each case where the rotational angular speed ω is the approximate straight line Ap1, Ap2, or Ap3 in the second region. Then, the CPU 14c stores the calculated time into the external storage device 15 or the internal storage device 14f. Then, with respect to each case of the approximate straight line Ap1, Ap2, or Ap3 in the second region, the CPU 14c calculates positioning time as the summed value of the constant speed time tc and the doubled acceleration time ta and stores the calculated value into the external storage device 15 or the internal storage device 14f. In such a manner, the CPU 14c can calculate the shortest positioning time among the positioning time te calculated for each of a plurality of sections obtained by dividing the second region, by calculating the positioning time te to rotate the motor output shaft at the rotational angular speed in the second region, from a break point to the maximum rotational angular speed, at each of the plurality of the sections.

In the case where the rotational angular speed ω is in the first region, similarly to the above-described first torque characteristic information (N-T characteristic), the CPU 14c calculates the acceleration time ta and the deceleration time td by the formula (10), stores the calculated values of the acceleration time ta and the deceleration time td into the external storage device 15 or the internal storage device 14f, and stores the value zero as the constant speed time tc into the external storage device 15 or the internal storage device 14f. The CPU 14c calculates the positioning time in the first region by the formula (11) and stores the calculated time into the external storage device 15 or the internal storage device 14f.

The CPU 14c stores the acceleration time ta, the constant speed time tc, and the deceleration time td of the positioning time te which is determined from the positioning time in the first region and the positioning time in the second region, into the external storage device 15 or the internal storage device 14f (step S86). Then, after step S86, the CPU 14c performs step S87 in the processing. In such a manner, in the second region from the break point ωc to the maximum rotational angular speed ωmax, the CPU 14c can perform a simulation in such a manner that the output shaft is rotated by the positioning angle θ in the acceleration time ta, the constant speed time tc, and the deceleration time td (=ta).

(Second Calculation Procedure)

Figure 15:
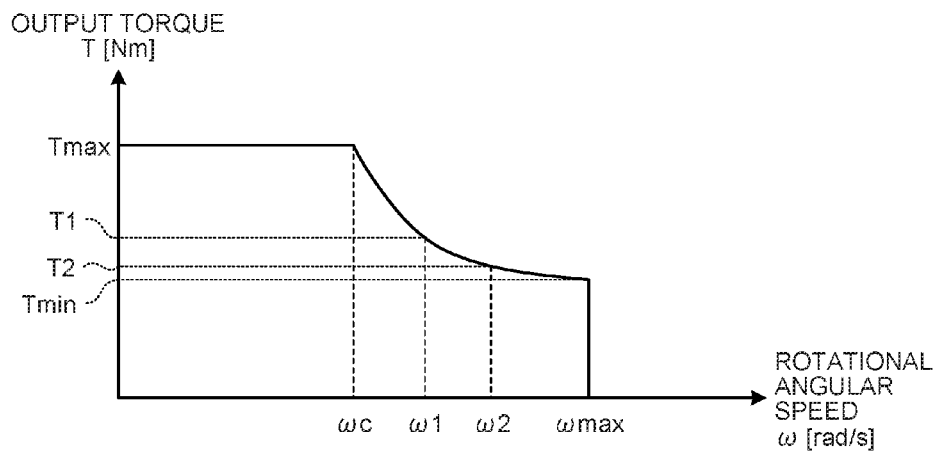
FIG. 15 is an explanatory diagram for describing a divisions of a rotational angular speed, for a calculation of output torque corresponding to speed, of the third torque characteristic information (N-T characteristic) illustrated in FIG. 13.

FIG. 15 is an explanatory diagram for describing a divisions of rotational angular speed, for a calculation of output torque corresponding to a speed, of the third torque characteristic information (N-T characteristic) illustrated in FIG. 13. The CPU 14c provides the nth-degree curve in the second region with a plurality of kinds of the rotational angular speed ω1 and ω2, in each of which the rotational angular speed ω exceeds the rotational angular speed ωc (rad/s) at the break point and is no more than the maximum rotational angular speed ωmax (rad/s), and calculates output torque T1 and T2, respectively. Note that the output torque T at the maximum rotational angular speed ωmax is the smallest value Tmin.

Based on the above-described formula (7), the CPU 14c calculates output torque T1 at the rotational angular speed ω1. The acceleration time ta in this case can be calculated as ω1×J/T1 based on the above-described formula (7). Then, based on the above-described formula (15), tc is θ/ω1−ta. Positioning time te is the sum of the acceleration time ta, the constant speed time tc, and the deceleration time td. In the case where the assumption that the acceleration time ta and the deceleration time td are equal is made to reduce the calculation load, the positioning time te is (ω1×J/T1+θ/ω1). The CPU 14c calculates the positioning time te at the rotational angular speed ω1 and stores the calculated time into the external storage device 15 or the internal storage device 14f. Similarly, based on the above-described formula (7), the CPU 14c calculates output torque T2 at the rotational angular speed ω2. The acceleration time ta in this case can be calculated as ω2×J/T2 based on the above-described formula (7). Then, based on the above-described formula (15), the constant speed time tc is θ/ω2−ta. The positioning time te is the sum of the acceleration time ta, the constant speed time tc, and the deceleration time td. In the case where the assumption that the acceleration time ta and the deceleration time td are equal is made to reduce the calculation load, the positioning time te is (ω2×J/T2+θ/ω2). The CPU 14c calculates the positioning time te at the rotational angular speed ω2 and stores the calculated time into the external storage device 15 or the internal storage device 14f. The positioning time te in which the motor output shaft is rotated at the rotational angular speed in the second region from the break point ωc to the maximum rotational angular speed is the shortest positioning time among the positioning time te calculated for each section after the second region is divided into the plurality of rotational angular speeds ω1 and ω2. In the embodiment, a description has been made with the two rotational angular speeds ω1 and ω2 as examples. However, there is no limitation in the number of divisions as long as positioning times te at three or more rotational angular speeds are calculated and a condition to be the smallest value can be calculated.

The CPU 14c stores the acceleration time ta, the constant speed time tc, and the deceleration time td of the positioning time te which is determined from the positioning time in the second region into the external storage device 15 or the internal storage device 14f (step S86). Then, after step S86, the CPU 14c performs step S87 in the processing.

The CPU 14c stores the acceleration time ta, the constant speed time tc, and the deceleration time td of one of the positioning time in the first region and the positioning time in the second region, which one becomes the positioning time te, into the external storage device 15 or the internal storage device 14f (step S86). Then, after step S86, the CPU 14c performs step S87 in the processing. In such a manner, in the second region from the break point ωc to the maximum rotational angular speed ωmax, the CPU 14c can perform a simulation in such a manner that the output shaft is rotated by the positioning angle θ in the acceleration time ta, the constant speed time tc, and the deceleration time td (=ta).

In the case of performing processing by the above-described first calculation procedure, the CPU 14c can reduce the calculation load compared to the case of performing processing by the second calculation procedure. In the case of performing processing by the above-described second calculation procedure, the CPU 14c can improve accuracy of a value of the positioning time te compared to the case of performing processing by the first calculation procedure.

A selected motor needs to be operated in such a manner that effective torque Te in the tp becomes equal to or lower than rated torque Tr determined for each motor. Since the acceleration time ta, the constant speed time tc, and the deceleration time td of the shortest positioning time te becomes the shortest in the case where the effective torque Te is equal to the rated torque Tr, the CPU 14c can calculate the stop time tb by the following formula (18) (step S87). However, in the case where the stop time tb which is a result of calculation of the following formula (18) becomes negative (tb<0), the CPU 14c stores the value zero as the stop time tb (tb=0) into the external storage device 15 or the internal storage device 14f.

$$tb = \frac{ta\{Ta^2 - Tr^2\} + tc\{Tc^2 - Tr^2\} + td\{Td^2 - Tr^2\}}{Tr^2 + Tb^2} \quad (18)$$

Also, in the case where it is assumed that torque in the cycle period tp, which is the sum of the positioning time te and the stop time tb, is the effective torque Te, the CPU 14c calculates the effective torque Te by the following formula (19). The CPU 14c provides the following formula (19) with the acquired torque Ta, Tc, Td, and Tb, acceleration time ta, constant speed time tc, deceleration time td, and stop time tb and calculates the effective torque Te.

$$Te = \sqrt{\frac{ta \times Ta^2 + tc \times Tc^2 + td \times Td^2 + tb \times Tb^2}{tp}} \quad (19)$$

Thus, the motor selection device 1 can calculate the effective torque Te approximate to an actual state based on operation pattern, constant load torque, and dynamic friction torque.

Figure 16:
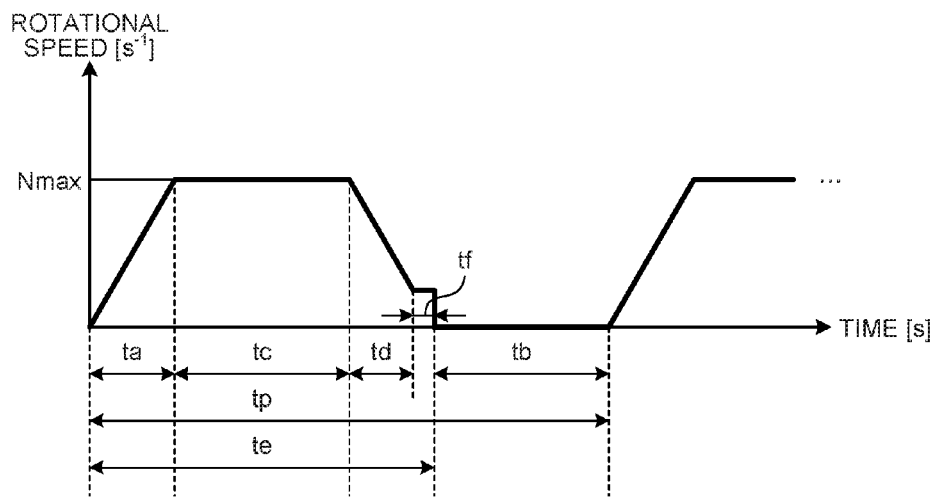
FIG. 16 is an explanatory diagram for describing a different example of the motor operation pattern according to the present embodiment.
Figures 17, 18:
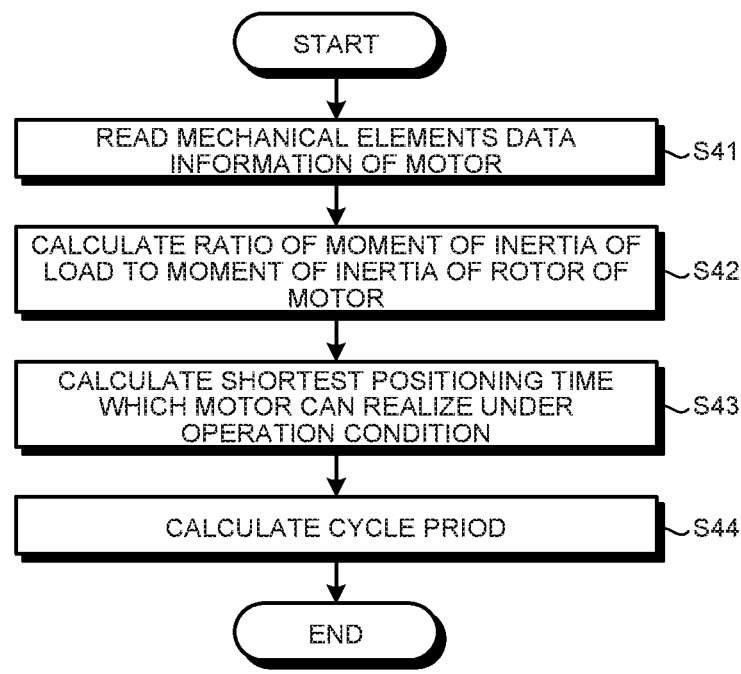
FIG. 17 is an explanatory diagram illustrating a different example of an input screen of the motor selection device according to the present embodiment.
FIG. 18 is a flowchart illustrating a simulation step of an operation pattern in which step a motor operation pattern is simulated.

FIG. 16 is an explanatory diagram for illustrating another example of the motor operation pattern of according to the present embodiment. FIG. 17 is an explanatory diagram illustrating another example of an input screen of the motor selection device according to the present embodiment. In the operation pattern illustrated in FIG. 16, settling time tf is secured between the deceleration time td and the stop time tb in addition to the deceleration time td. The settling time tf is a period from when a command of the positioning time te for the motor is completed until when positioning is performed constantly within a repeated positioning accuracy range. For example, the CPU 14c of the control device 11 adds, to the input screen G1, a box B4 for an additional condition, and receives a choice of any one of check boxes R1 to R3 as an input value of each of settling time tf in the Box B4 illustrated in FIG. 17 out of the simulation conditions input from the input device 12.

Next, as illustrated in FIG. 4, by an execution command from an execution button B3 on the input screen G1 which command is input from the input device 12, the CPU 14c of the control device 11 performs step S2 in the processing and determines whether the input value of a positioning angle C11 and the input value of the moment of inertia of the load C21 are stored, as the operation conditions, in the external storage device 15 or the internal storage device 14f. In the case where no operation condition is input (step S2, No), the CPU 14c of the control device 11 instructs the display device 13 to display an error display and brings the processing back to step S1. In the case where the operation conditions are input (step S2, Yes), the CPU 14c of the control device 11 performs step S3 in the processing.

Next, as illustrated in FIG. 4, the CPU 14c of the control device 11 determines, as a requested condition, whether at least the input value of requested positioning time C12 is stored in the external storage device 15 or the internal storage device 14f. In the case where no requested condition is input (step S3, No), the CPU 14c of the control device 11 instructs the display device 13 to display an error display and brings the processing back to step S1. In the case where the requested condition is input (step S3, Yes), the CPU 14c of the control device 11 performs step S4 in the processing.

In the present embodiment, the requested condition is the input value C12 of requested positioning time. Specifically, the requested condition is that at least one of the input value C12 of requested positioning time and the input value C13 of requested stop time is input and stored into the external storage device 15 or the internal storage device 14f. With respect to the requested condition, in addition to the state that at least one of the input value C12 of requested positioning time and the input value C13 of requested stop time is input and stored into the external storage device 15 or the internal storage device 14f, one or more of the input value C14 of the torque limit, the input value C15 of the maximum rotational speed limit, the input value C22 of load torque (constant), and the input value C23 of dynamic friction torque may be further input and stored into the external storage device 15 or the internal storage device 14f.

Next, the CPU 14c of the control device 11 executes the simulation step to simulate the operation pattern of each motor under the above-described simulation condition (step S4). FIG. 18 is a flowchart illustrating a simulation step of an operation pattern in which step a motor operation pattern is simulated. As illustrated in FIG. 18, the CPU 14c of the control device 11 reads mechanical elements data information DB of the motor, which is stored in the external storage device 15 or the internal storage device 14f, and stores/holds the mechanical elements data information DB in the RAM 14e (step S41).

Then, the CPU 14c of the control device 11 calculates a ratio of the moment of inertia of the load to the rotor inertia moment of the motor based on the input value C21 of the moment of inertia of the load and the rotor inertia moment read in step S41 (step S42).

Then, the CPU 14c of the control device 11 calculates the shortest positioning time, which is the shortest positioning time which the motor can realize, based on the value calculated in step S42, the input value C11 of the positioning angle which is an operation condition, and the rotational speed-torque characteristic (N-T characteristic) (step S43). As described above, in step S43, the CPU 14c can calculate acceleration time ta, constant speed time tc, deceleration time td, and positioning time te of each motor by performing processing of step S81 to step S87 indicated in the flowchart illustrated in FIG. 9 based on above-described input value C21 of the moment of inertia of the load, input value C11 of a positioning angle, and at least on information of the rotor inertia moment and the rotational speed-torque characteristic (N-T characteristic) among the mechanical elements data information DB. Then, the CPU 14c sets, as the shortest positioning time, the shortest value in the positioning time te.

Then, the CPU 14c of the control device 11 calculates cycle period tp by summing the shortest positioning time calculated in step S43 and the stop time tb acquired by the calculation of the above-described formula (18) (step S44).

Figure 19:
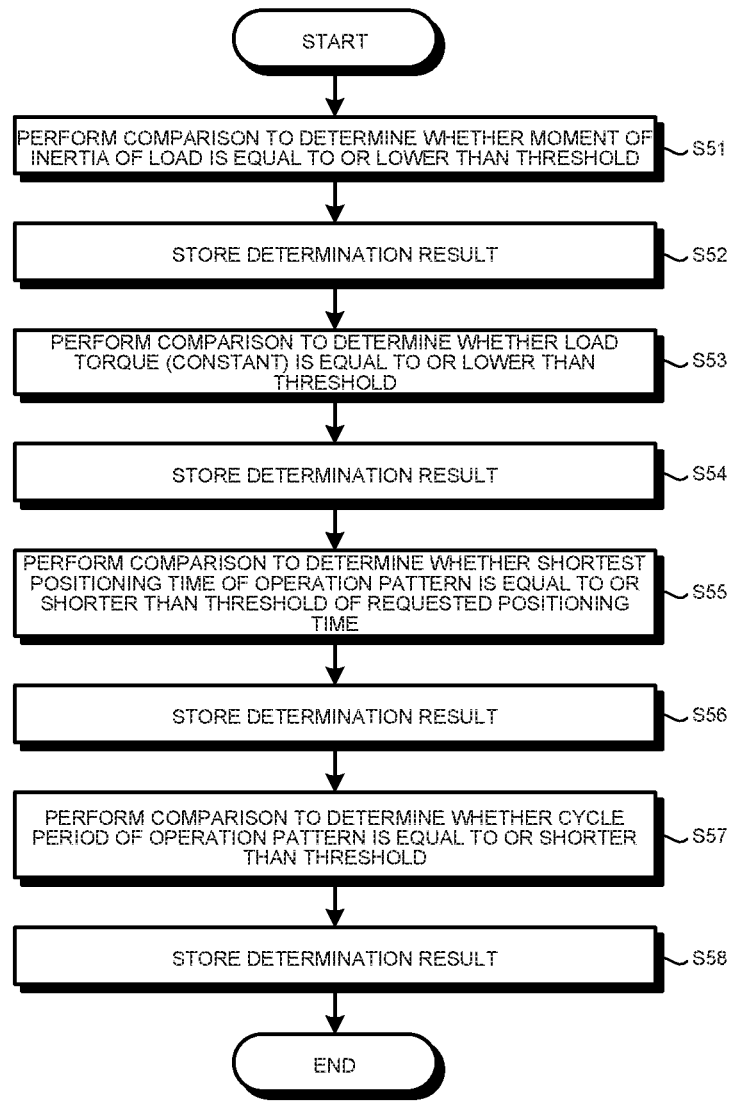
FIG. 19 is a flowchart illustrating a step of comparison with an operation condition and a requested condition.

Next, the CPU 14c of the control device 11 performs a step of comparing with the operation condition and the requested condition in which step an operation pattern of each motor acquired in the simulation step (step S4) is compared with the operation condition and the requested condition, specifically compared with a predetermined threshold in each item in steps S51, S53, S55 and S57 as described below, and a determination result indicating adaptable or non-adaptable is stored into the external storage device 15 or the internal storage device 14f (step S5). Accordingly, since the motor selection device 1 selects the motor based on the simulated operation pattern, it is possible to reduce a calculation load for a worker. FIG. 19 is a flowchart illustrating a step of comparison with the operation condition and the requested condition. First, the CPU 14c of the control device 11 compares the moment of inertia of the load with a threshold of each motor stored in the external storage device 15 or the internal storage device 14f. In the case where the moment of inertia of the load is evaluated as the ratio of the moment of inertia of the load to the rotor inertia moment of the motor, which ratio is calculated in step S42, and in the case where the ratio is not more than a predetermined threshold, such as 100 times, information indicating adaptable (OK) is generated. Alternatively, in the case where the CPU 14c compares the moment of inertia of the load with a threshold of each motor stored in the external storage device 15 or the internal storage device 14f and in a case where the moment of inertia of the load is evaluated as the ratio of the moment of inertia of the load to the rotor inertia moment of the motor, which ratio is calculated in step S42, and exceeds a predetermined threshold such as 100 times, information indicating non-adaptable (NG) is generated (step S51). The CPU 14c of the control device 11 stores, as a determination result, one of the information acquired in step S51 indicating adaptable (OK) and the information indicating non-adaptable (NG) in comparison with the threshold, into the external storage device 15 or the internal storage device 14f (step S52).

Next, the CPU 14c of the control device 11 compares load torque (constant) with a threshold of each motor stored in the external storage device 15 or the internal storage device 14f. In the case where the load torque (constant) is within the threshold, information indicating adaptable (OK) is generated and in the case where the load torque (constant) exceeds the threshold, information indicating non-adaptable (NG) is generated (step S53). The CPU 14c of the control device 11 stores, as a determination result, one of the information indicating adaptable (OK) and the information indicating non-adaptable (NG) in comparison with the threshold, which information is acquired in step S53, into the external storage device 15 or the internal storage device 14f (step S54).

Next, the CPU 14c of the control device 11 compares the shortest positioning time of an operation pattern of each motor, which is acquired in the simulation step (step S4), with a threshold of the requested positioning time stored in the external storage device 15 or the internal storage device 14f. In the case where the shortest positioning time is equal to or shorter than the threshold, information indicating adaptable (OK) is generated and in the case where the shortest positioning time exceeds the threshold, information indicating non-adaptable (NG) is generated (step S55). The CPU 14c of the control device 11 stores, as a determination result, one of the information indicating adaptable (OK) and the information indicating non-adaptable (NG) in comparison with the threshold, which information is acquired in step S55, into the external storage device 15 or the internal storage device 14f (step S56).

Then, the CPU 14c of the control device 11 compares cycle period of an operation pattern of each motor, which is acquired in the simulation step (step S4), with a threshold which is a summed value of the requested positioning time and the requested stop time stored in the external storage device 15 or the internal storage device 14f. In the case where the cycle period of the operation pattern is equal to or shorter than the threshold, the CPU 14c generates information indicating adaptable (OK) and in the case where the cycle period of the operation pattern exceeds the threshold, the CPU 14c generates information indicating non-adaptable (NG) (step S57). The CPU 14c of the control device 11 stores, as a determination result, one of the information indicating adaptable (OK) and the information indicating non-adaptable (NG) in comparison with the threshold, which information is acquired in step S57, into the external storage device 15 or the internal storage device 14f (step S58).

FIG. 20 is an explanatory diagram of an output display screen displaying an example of items compared in the step of comparison with an operation condition and a requested condition and an example of determination results. The CPU 14c of the control device 11 may execute the above-described processing of step S51 to step S58 with respect to each motor and may display an output display screen G2 illustrated, for example, in FIG. 20. The CPU 14c of the control device 11 may store, into the external storage device 15 or the internal storage device 14f, information of a comment linked to the information indicating non-adaptable (NG), in each item compared in the step of comparison with the operation condition and the requested condition, and the CPU 14c may display the output display screen G2 along with the information indicating non-adaptable (NG), in each item.

Next, as illustrated in FIG. 4, the CPU 14c of the control device 11 performs an comprehensive determination step to calculate an comprehensive determination result according to an adaptable (OK) item acquired in step S5, to link the comprehensive determination result to each motor, and to store the comprehensive determination result into the external storage device 15 or the internal storage device 14f (step S6). An comprehensive determination result is a determination result in a plurality of stages (such as three stages), and a circle mark (◯) indicating adaptable, a triangle mark (Δ) indicating partially adaptable, or a cross mark (x) indicating non-adaptable is assigned to the comprehensive determination result. A determination result indicating adaptable is information assigned in a case where information indicating adaptable (OK) is included with respect to all items compared by the CPU 14c of the control device 11 in step S5. A determination result indicating partially adaptable is information assigned in a case where information indicating adaptable (OK) is included with respect to all items in the operation condition compared by the CPU 14c of the control device 11 in step S5 and information indicating non-adaptable (NG) is included with respect to an item in the requested condition. A determination result indicating non-adaptable is information assigned in a case where information indicating non-adaptable (NG) is included with respect to an item of the operation condition compared by the CPU 14c of the control device 11 in step S5.

Next, as illustrated in FIG. 4, the CPU 14c of the control device 11 executes a list display step to display a list of motors on the display device 13 along with the comprehensive determination result stored in step S6 (step S7). FIG. 21 is an explanatory diagram of an output display screen displaying an example of the comprehensive determination result. The CPU 14c of the control device 11 displays an output display screen G3 illustrated, for example, in FIG. 21 in such a manner that an comprehensive determination result corresponding to each motor can be recognized.

For example, the display device 13 displays, on the output display screen G3, a list B31 as a list of simulation results, an input screen button B32, and a selection button B33. The list B31 includes a column BS of a series name, a column BN of the call number of each motor (index of motor), a column BJ of a result of an comprehensive determination of each motor which result is stored in step S6, a column BTXT of a comment on a determination, and a column RN of a check-box to select each row of each motor. Accordingly, a worker can grasp a choice of an adaptable motor at a glance.

In the case where the user checks a display of the list B31, selects a check-box of a row of the motor corresponding to the circle mark (◯) indicating adaptable, and pushes the selection button B33 (step S8, Yes), the CPU 14c of the control device 11 ends the processing. In the case where the user checks the display of the list B31, selects a check-box of a row of the motor corresponding to one of the triangle mark (Δ) indicating partially adaptable and the cross mark (x) indicating non-adaptable, and pushes the input screen button B32 (step S8, No), the CPU 14c of the control device 11 brings the processing back to step S1, performs input reception processing of a simulation condition, and acquires information of the simulation condition.

By this method, even when the motor operation pattern is not established, it is possible to estimate the motor with an optimal operation pattern among a plurality of selectable motors based on an comprehensive determination result. For example, the worker can leave, as a choice, the motor with a triangle mark (Δ) indicating partially adaptable. Since the motor which is not adaptable in the item of the operation condition is removed, it is possible to remove an unusable motor from a choice and to narrow down a target of the motor. Thus, since the motor operation pattern can be considered by reconsideration of an operation pattern performed by the user, it is possible to reduce a possibility of selecting the motor having an excessive performance. Accordingly, it is possible to consider a motor operation pattern after narrowing down target of the motors. Thus, it is possible to reduce a possibility of selecting the motor having an excessive performance.

As described above, the motor selection device 1 can select a plurality of selectable motors 20 and can suggest an optimal operation pattern among operation patterns prescribed by the positioning time te, during which the motor output shaft 21 of the motor 20 rotates by the positioning angle to rotate the load 50, and the stop time tb during which the motor output shaft 21 is stopped. The motor selection device 1 includes the input access unit, the storage unit, the calculation unit, and the information output unit.

As the input access unit, the control device 11 performs input reception processing, from the input device 12, of information of the simulation condition including the input value C11 of the positioning angle and the input value C21 of the moment of inertia of the load as operation conditions and including at least one of the input value C12 of requested positioning time and the input value C13 of requested stop time as a requested condition. As the storage unit, the external storage device 15 or the internal storage device 14f stores the mechanical elements data information DB of each selectable motor. As the calculation unit, the CPU 14c of the control device 11 simulates the operation pattern under the simulation condition of each stored motor, compares the acquired operation pattern of each motor with the predetermined threshold in each item of the operation condition and the requested condition, and can calculate the comprehensive determination result according to the acquired adaptable item. Then, as the information output unit, the control device 11 links the comprehensive determination result to each motor and outputs information of the list of motors onto the display device 13.

With this configuration, even when a motor operation pattern is not established, it is possible to estimate the motor with an optimal operation pattern among the plurality of selectable motors based on the comprehensive determination result. Accordingly, it is possible to consider the motor operation pattern after narrowing down target of the motors. Thus, it is possible to reduce a possibility of selecting the motor having an excessive performance.

Modification Example

Figure 22:
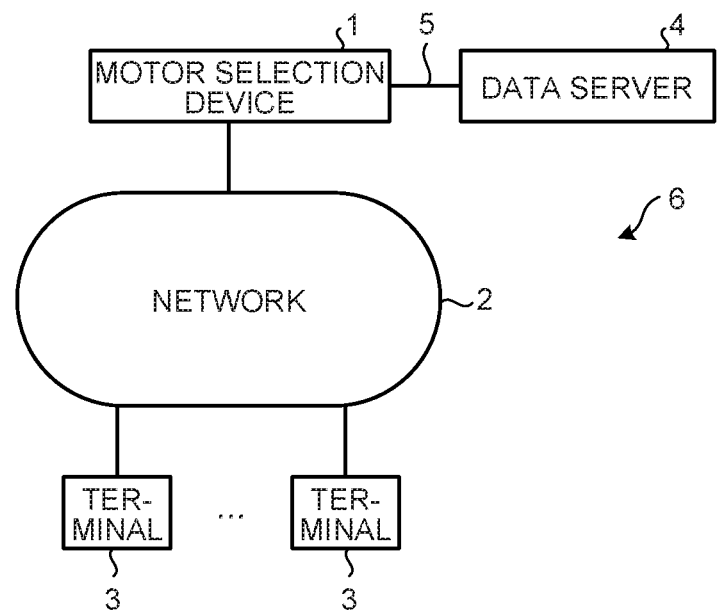
FIG. 22 is an explanatory diagram for describing a modification example in which the motor selection device according to the present embodiment is configured as a client server system through a network.

FIG. 22 is an explanatory diagram for describing a modification example in which the motor selection device according to the present embodiment is configured as a client server system through a network. Note that in the modification example of the present embodiment, the same reference sign is assigned to a member identical to what has been described in the above embodiment and an overlapped description is omitted.

A client server system 6 includes the motor selection device 1, a network 2, at least one terminal 3, a data server 4, and a network 5. The terminal 3 and the data server 4 are computers. Each of the terminal 3 and the data server 4 includes the above-described input interface 14a, output interface 14b, CPU 14c, ROM 14d, RAM 14e, internal storage device 14f, communication control device 14g, and inner bus 14h and has a configuration identical to that of the motor selection device 1, devices corresponding to the input device 12 and the display device 13 being connected thereto.

At least one terminal 3 is connected to the motor selection device 1 through the network 2. The network 2 is, for example, the Internet. Then, at least one terminal 3 functions as an input access unit to receive an input operation or a selection operation performed by a designer who is a user and to output an input signal to a control device 11 of the motor selection device 1 through the network 2. Also, at least one terminal 3 functions as an information output unit to display information transmitted from the motor selection device 1.

In the case where the external storage device 15 is a server, the data server 4 is connected to the control device 11 through the network 5 such as a local area network (LAN) instead of the external storage device 15. Note that the data server 4 may be provided at a place away from the control device 11 of the motor selection device 1 and may be connected to the motor selection device 1 through the network 2 instead of the network 5.

As described above, the motor selection device 1 according to the present embodiment is configured as the client server system 6 through the network 2.

REFERENCE SIGNS LIST 1 motor selection device
2 network
3 terminal
4 data server
5 network
6 client server system
11 control device
12 input device
13 display device
14a input interface
14b output interface
14c CPU
14d ROM
14e RAM
14f internal storage device
14g communication control device
14h inner bus
15 external storage device
20 motor
21 motor output shaft
50 load
52 conveying plate
53 conveyed object
54 bearing
55 oil seal
90 motor control circuit
ta acceleration time
tb stop time
tc constant speed time
td deceleration time
te positioning time
tf settling time
tp cycle period
T output torque
Ta, Tb, Tc, Td torque
Te effective torque
Ti dynamic friction torque
Tm constant load torque
Zr rotary shaft

The invention claimed is:

1. A motor selection device comprising:
a computer including a storage device and a calculation device in order to select a plurality of selectable motors and to suggest an optimal operation pattern among motor operation patterns, each of the motor operation patterns being prescribed by positioning time during which a motor output shaft of a motor rotates by a positioning angle to rotate a load, and stop time during which the motor output shaft is stopped,
wherein the storage device is configured to store acceleration time during which the motor output shaft is accelerated in the positioning time, store constant speed time in which the motor output shaft is rotated at a constant speed in the positioning time, store deceleration time in which the motor output shaft is decelerated in the positioning time, store the stop time, and store maximum output torque for each motor which each of the motor can output, dynamic friction torque, and constant load torque by the load, and
the calculation device includes a central processing unit (CPU) and is configured to perform effective torque calculation, the effective torque calculation including:
reading the maximum output torque, the dynamic friction torque, the constant load torque the acceleration time, the constant speed time, the deceleration time, and the stop time which are stored in the storage unit,
calculating a first torque in the acceleration time which is a sum of the maximum output torque, the dynamic friction torque, and the constant load torque, calculating a second torque in the constant speed time which is a sum of the dynamic friction torque and the constant load torque, calculating a third torque in the deceleration time which is the sum of the maximum output torque, the dynamic friction torque, and the constant load torque by the load, calculating a fourth torque in the stop time with the constant load torque, and calculating the effective torque by giving the first torque, the second torque, the third torque, the fourth torque, the acceleration time, the constant speed time, the deceleration time, and the stop time to following formula (1), where Te is the effective torque, ta is the acceleration time, tc is the constant speed time, td is the deceleration time, tb is the stop time, Ta is the first torque, tc is the second torque, td is the third torque, tb is the fourth torque, and tp is a cycle period and a sum of ta, tc, td, and tb.

$$Te = \sqrt{\frac{ta \cdot Ta^2 + tc \cdot Tc^2 + td \cdot Td^2 + tb \cdot Tb^2}{tp}}. \qquad (1)$$

2. The motor selection device according to claim 1, further comprising an input access device configured to perform input reception processing of information of a simulation condition, the simulation condition including, as an operation condition, an input value of a positioning angle and an input value of a moment of inertia of a load and including, as a requested condition, at least one of an input value of requested positioning time and an input value of requested stop time, wherein the storage device is configured to store mechanical elements data information and the information of the simulation condition of each selectable motor, and the calculation device is configured to calculate the effective torque based on the acceleration time, the constant speed time, the deceleration time, and the stop time in the simulation condition of each motor stored in the storage device, simulate an operation pattern with shortest positioning time which can be realized with the effective torque, compare the acquired operation pattern of each motor with the operation condition and the requested condition, compare with a predetermined threshold in each item of the operation condition and the requested condition, and calculate an comprehensive determination result according to an acquired adaptable item.

3. The motor selection device according to claim 2, further comprising an information output device configured to link the comprehensive determination result to each motor and to output information of a list of the motor, wherein the input access device can receive selection of one motor through the list of the motor.

4. The motor selection device according to claim 3, wherein in the case where an item of the operation condition is adaptable and an item of the requested condition is not adaptable, the calculation device is configured to give a determination result indicating partially adaptable as the comprehensive determination result, and the information output device is configured to output information including the determination result indicating partially adaptable in the list of the motor.

* * * * *